United States Patent
Lee et al.

(10) Patent No.: US 11,749,782 B2
(45) Date of Patent: Sep. 5, 2023

(54) DISPLAY DEVICE

(71) Applicant: SAMSUNG DISPLAY CO., LTD., Yongin-si (KR)

(72) Inventors: Ji Hye Lee, Yongin-si (KR); Jin Seon Kwak, Yongin-si (KR); Yong Hee Lee, Yongin-si (KR); Ki Hyun Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/556,592

(22) Filed: Dec. 20, 2021

(65) Prior Publication Data
US 2022/0336708 A1    Oct. 20, 2022

(30) Foreign Application Priority Data
Apr. 20, 2021   (KR) .......................... 10-2021-0051287

(51) Int. Cl.
*H01L 33/38*    (2010.01)
*H01L 25/075*   (2006.01)
(Continued)

(52) U.S. Cl.
CPC .............. *H01L 33/382* (2013.01); *G09G 3/32* (2013.01); *H01L 25/0753* (2013.01);
(Continued)

(58) Field of Classification Search
CPC ....... H01L 33/382; H01L 33/24; H01L 33/62; H01L 25/0753; G09G 3/32; G09G 2300/0426
See application file for complete search history.

(56) References Cited

U.S. PATENT DOCUMENTS

| 11,362,136 B2 | 6/2022 | Kong et al. |
| 2022/0077227 A1 | 3/2022 | Kang et al. |

(Continued)

FOREIGN PATENT DOCUMENTS

| KR | 10-2014-0143046 A | 12/2014 |
| KR | 10-2020-0042075 A | 4/2020 |

(Continued)

OTHER PUBLICATIONS

International Search Report for PCT/KR2022/005606 dated Aug. 9, 2022, 3 pages.

*Primary Examiner* — Kenneth B Lee, Jr.
(74) *Attorney, Agent, or Firm* — Lewis Roca Rothgerber Christie LLP

(57) ABSTRACT

A display device according to an embodiment of the present disclosure may include pixels including a first pixel and a second pixel sequentially arranged in a display area along a first direction, each of the first pixel and the second pixel including sub pixels arranged along a second direction corresponding to emission areas, and a first power line and a second power line connected to the pixels. Each of the sub pixels may include a light emitting element, a first electrode connected between the light emitting element and the first power line, and a second electrode connected between the light emitting element and the second power line. The second electrodes of the sub pixels of the first and second pixels may be integrally connected to each other to configure an integrated electrode, and may be commonly connected to the second power line through a first contact portion.

20 Claims, 16 Drawing Sheets

(51) Int. Cl.
   *H01L 33/24*   (2010.01)
   *G09G 3/32*   (2016.01)
   *H01L 33/62*   (2010.01)
(52) U.S. Cl.
   CPC .............. *H01L 33/24* (2013.01); *H01L 33/62*
                        (2013.01); *G09G 2300/0426* (2013.01)

(56)            References Cited

U.S. PATENT DOCUMENTS

2022/0102322 A1*  3/2022  Kum .................. H01L 33/58
2022/0123026 A1   4/2022  Oh et al.
2022/0158052 A1   5/2022  Lee et al.

FOREIGN PATENT DOCUMENTS

| KR | 10-2020-0079379 A | 7/2020 |
| KR | 10-2020-0088954 A | 7/2020 |
| KR | 10-2020-0102607 A | 9/2020 |
| KR | 10-2021-0021769 A | 3/2021 |
| WO | WO 2021/215585 A1 | 10/2021 |

* cited by examiner

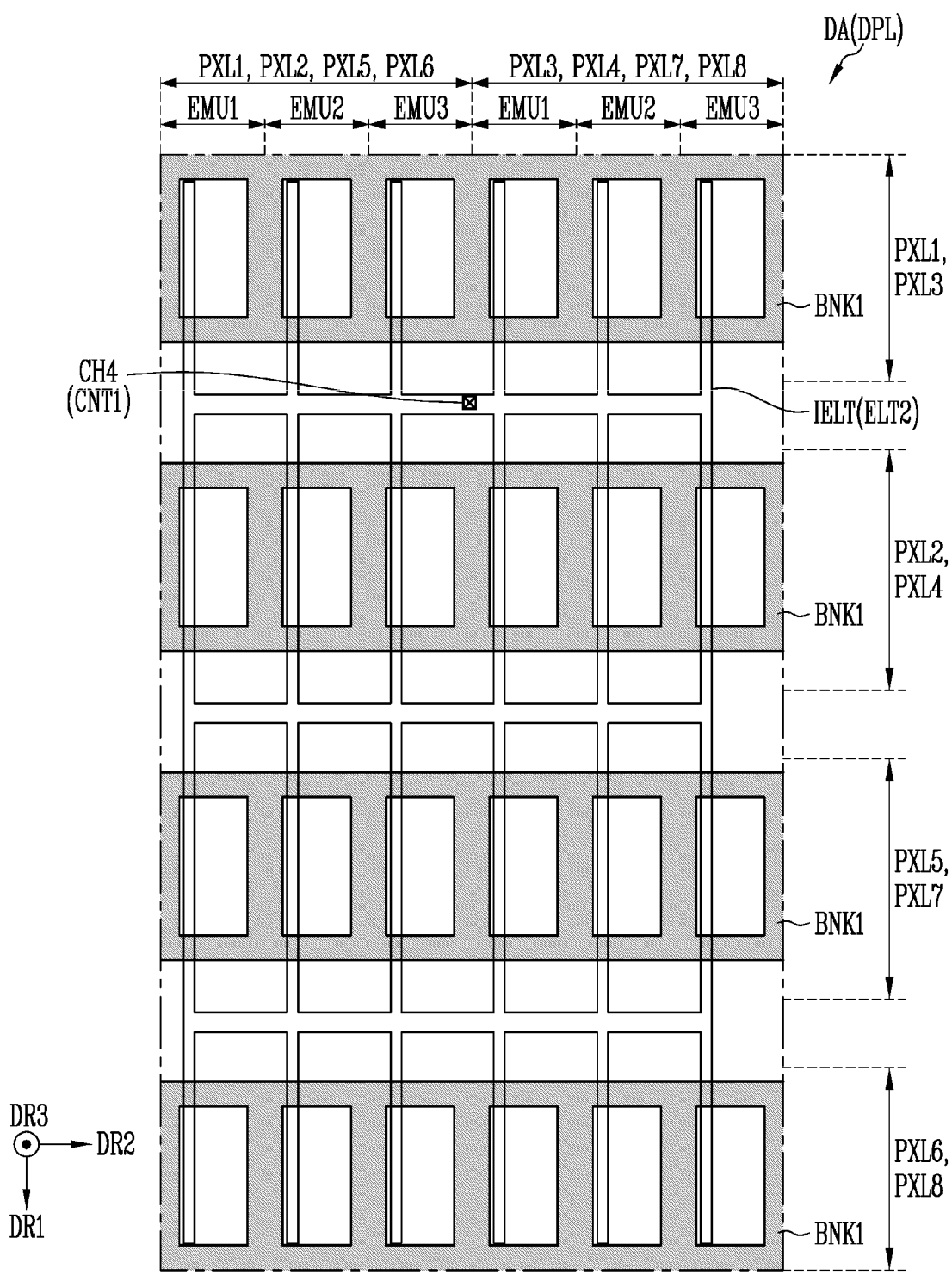

DISPLAY DEVICE

CROSS-REFERENCE TO RELATED APPLICATION

This application claims priority to and the benefit of Korean Patent Application No. 10-2021-0051287, filed on Apr. 20, 2021, in the Korean Intellectual Property Office, the entire content of which is incorporated by reference herein.

BACKGROUND

1. Field

One or more embodiments of the present disclosure relate to a display device.

2. Description of the Related Art

Recently, interest in information display has been increasing. Accordingly, research and development of a display device has been continuously conducted.

SUMMARY

One or more aspects and features of embodiments of the present disclosure are to provide a display device having a reduced number of contact portions in a display area.

Aspects and features of the present disclosure are not limited to the above-described aspects and features, and other aspects and features of embodiments of the present disclosure that are not described will be clearly understood by those skilled in the art from the following description.

A display device according to one or more embodiments of the present disclosure may include pixels including a first pixel and a second pixel sequentially arranged in a display area along a first direction, each of the first pixel and the second pixel including sub pixels arranged along a second direction corresponding to emission areas, and a first power line and a second power line connected to the pixels. Each of the sub pixels may include a light emitting element, a first electrode connected between the light emitting element and the first power line, and a second electrode connected between the light emitting element and the second power line. The second electrodes of the sub pixels of the first and second pixels may be integrally connected to each other to configure an integrated electrode, and may be commonly connected to the second power line through a first contact portion.

In one or more embodiments, the integrated electrode may include first pattern portions extending in the first direction in each of the sub pixels of the first and second pixels, and a second pattern portion extending in the second direction between the first and second pixels and connecting the first pattern portions.

In one or more embodiments, the second power line may include a sub power line between the first pixel and the second pixel. The sub power line may extend in the second direction in the display area and overlap the second pattern portion.

In one or more embodiments, the pixels may further include a third pixel arranged adjacently to the first pixel along the second direction, and a fourth pixel arranged adjacently to the second pixel along the second direction.

In one or more embodiments, the second electrodes of the sub pixels of the first to fourth pixels may be integrally connected to each other to configure the integrated electrode, and may be commonly connected to the second power line through the first contact portion.

In one or more embodiments, the pixels may further include fifth and sixth pixels sequentially arranged adjacently to the first and second pixels along the first direction. The second electrodes of sub pixels of the first, second, fifth, and sixth pixels may be integrally connected to each other to configure the integrated electrode, and may be commonly connected to the second power line through the first contact portion.

In one or more embodiments, the pixels may further include a seventh pixel arranged adjacently to the fifth pixel along the second direction, and an eighth pixel arranged adjacently to the sixth pixel along the second direction. The second electrodes of sub pixels of the first to eighth pixels may be integrally connected to each other to configure the integrated electrode, and may be commonly connected to the second power line through the first contact portion.

In one or more embodiments, the display device may further include a first bank located in the display area around the emission area of each of the sub pixels of the pixels. The first bank may include first openings individually opened in correspondence with the emission area of each of the sub pixels of the pixels, and second openings collectively opened between pixel rows sequentially arranged along the first direction.

In one or more embodiments, each of the sub pixels may include a light emitting unit including the light emitting element, the first electrode, and the second electrode, and a pixel circuit connected between the light emitting unit and the first power line.

In one or more embodiments, the display device may further include a display layer including the light emitting units of the sub pixels and the first bank, and a pixel circuit layer overlapping the display layer and including pixel circuits of the sub pixels, the first power line, and the second power line.

In one or more embodiments, the light emitting unit may further include a first alignment electrode located at the display layer and positioned between the pixel circuit layer and the first electrode, and a second alignment electrode located at the display layer and positioned between the pixel circuit layer and the second electrode.

In one or more embodiments, the first alignment electrodes of the sub pixels may be separated from each other, and the second alignment electrodes of the sub pixels may be connected to each other.

In one or more embodiments, the first alignment electrodes of the sub pixels may be connected to respective pixel circuits through respective first contact holes, and the second alignment electrodes of the sub pixels may be connected to the second power line through respective second contact holes.

In one or more embodiments, the first electrodes of the sub pixels may be connected to respective first alignment electrodes through respective third contact holes, and may be connected to the first power line through the respective first alignment electrodes and the respective pixel circuits, and the second electrodes of the sub pixels may be connected to the second power line through the first contact portion.

In one or more embodiments, the third contact holes of the sub pixels and the first contact portion may be located in a region corresponding to the second openings so as not to overlap the first bank.

In one or more embodiments, the light emitting unit may include an intermediate electrode connected between the first electrode and the second electrode, a first light emitting element connected between the first electrode and the intermediate electrode, and a second light emitting element connected between the intermediate electrode and the second electrode.

In one or more embodiments, the light emitting units of the sub pixels of the first pixel may be arranged along the second direction in a first pixel area in which the first pixel is provided, and the pixel circuits of the sub pixels of the first pixel may be arranged along the first direction in the first pixel area.

In one or more embodiments, the display device may further include scan lines connected to the pixels. Each of the scan lines may include a plurality of sub scan lines extending in the first direction and the second direction, respectively, in the display area.

In one or more embodiments, the first power line may include a (1-1)-th sub power line and a (1-2)-th sub power line extending in the first direction and the second direction, respectively, in the display area, and the second power line may include a (2-1)-th sub power line and a (2-2)-th sub power line extending in the first direction and the second direction, respectively, in the display area.

In one or more embodiments, the integrated electrode may extend in the second direction in a region overlapping the (2-2)-th sub power line, and may be connected to the (2-2)-th sub power line through the first contact portion.

Details of one or more embodiments of the present disclosure are included in the detailed description and drawings.

According to one or more embodiments of the present disclosure, the second electrodes of the sub pixels included in the plurality of pixels including the first and second pixels sequentially arranged along the first direction may be integrally connected, and the second electrodes may be commonly connected to the second power line through the first contact portion. Accordingly, the number of contact portions formed between the pixels and the second power line may be reduced.

Additionally, according to one or more embodiments of the present disclosure, the first bank disposed in the display area around (e.g., surround) the emission area of each of the sub pixels may be integrally opened between adjacent pixel rows, and the first electrodes and the second electrodes of the sub pixels may be connected to the first alignment electrodes and the second power line, respectively, in a region where the first bank is integrally opened. Accordingly, the first electrodes and the second electrodes of the sub pixels may be easily formed.

Effects, aspects, and features of embodiments according to the present disclosure are not limited by the contents illustrated above, and more various effects, aspects, and features are included in the present disclosure.

BRIEF DESCRIPTION OF THE DRAWINGS

The above and other aspects and features of embodiments of the present disclosure will become more apparent by describing in further detail embodiments thereof with reference to the accompanying drawings, in which:

FIGS. 14-16 are plan views each illustrating second electrodes and a first bank according to one or more embodiments of the present disclosure.

DETAILED DESCRIPTION

Figure 1:
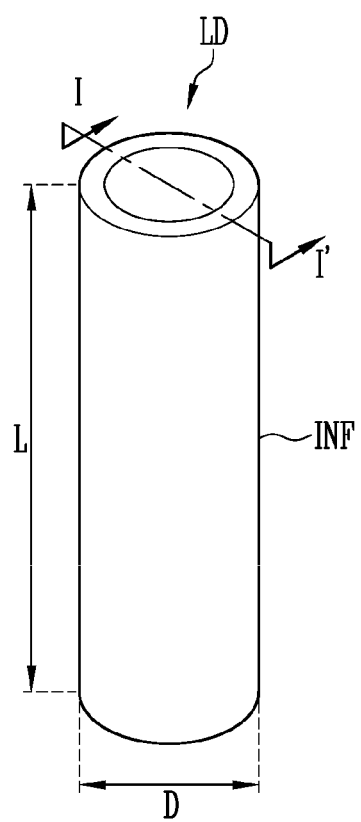
FIG. 1 is a perspective view illustrating a light emitting element according to one or more embodiments of the present disclosure.

The present disclosure may be modified in various ways and may have various forms, and specific embodiments will be illustrated in the drawings and described in detail herein. In the following description, the singular forms also include the plural forms unless the context clearly includes the singular.

The present disclosure is not limited to the embodiments disclosed below, and may be modified in various forms and may be implemented. In addition, each of the embodiments disclosed below may be implemented alone or in combination with at least one of other embodiments.

In the drawings, some components that are not directly related to a characteristic of the present disclosure may be omitted to clearly represent the present disclosure. Throughout the drawings, the same or similar components will be represented by the same reference numerals and symbols as much as possible even though they are shown in different drawings, and repetitive descriptions will be omitted.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 2:
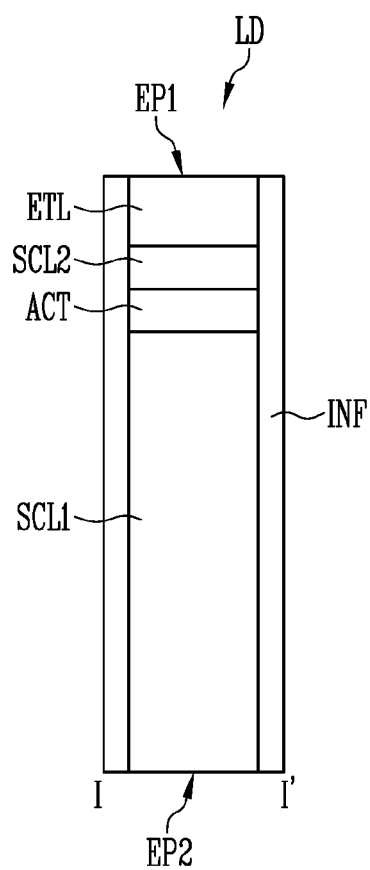
FIG. 2 is a cross-sectional view illustrating the light emitting element according to one or more embodiments of the present disclosure.

FIG. 1 is a perspective view illustrating a light emitting element LD according to one or more embodiments of the present disclosure. FIG. 2 is a cross-sectional view illustrating the light emitting element LD according to one or more embodiments of the present disclosure. For example, FIG. 1 illustrates an example of the light emitting element LD that may be used as a light source of a display device according to one or more embodiments of the present disclosure, and FIG. 2 illustrates an example of a cross-section of the light emitting element LD taken along the line I-I' of FIG. 1.

Referring to FIGS. 1 and 2, the light emitting element LD includes a first semiconductor layer SCL1, an active layer ACT, and a second semiconductor layer SCL2, which are sequentially disposed along a direction (for example, a length direction), and an insulating film INF around (e.g., surrounding) outer surfaces (e.g., outer circumferential or peripheral surfaces) (for example, side surfaces) of the first semiconductor layer SCL1, the active layer ACT, and the second semiconductor layer SCL2. In addition, the light emitting element LD may selectively further include an electrode layer ETL disposed on the second semiconductor layer SCL2. In this case, the insulating film INF may or may not at least partially be around (e.g., surround) an outer surface (e.g., an outer circumferential or peripheral surface) of the electrode layer ETL. In addition, according to one or more embodiments, the light emitting element LD may further include another electrode layer disposed on one surface (for example, a lower surface) of the first semiconductor layer SCL1.

In one or more embodiments, the light emitting element LD is provided in a bar (or rod) shape extending in a direction, and may have a first end portion EP1 and a second end portion EP2 at respective ends in a length direction (or a thickness direction) of the light emitting element LD. The first end portion EP1 may be a first surface (or an upper surface) of the light emitting element LD, and the second end portion EP2 may be a second surface (or a lower surface) of the light emitting element LD.

In describing one or more embodiments of the present disclosure, the term "bar shape" may include a rod-like shape or a bar-like shape having an aspect ratio greater than 1, such as a circular column or a polygonal column, and a shape of a cross section thereof is not particularly limited. For example, a length L of the light emitting element LD may be greater than a diameter D (or a width of the cross section) thereof.

The first semiconductor layer SCL1, the active layer ACT, the second semiconductor layer SCL2, and the electrode layer ETL may be sequentially disposed in a direction from the second end portion EP2 to the first end portion EP1 of the light emitting element LD. That is, the first semiconductor layer SCL1 may be disposed at the second end portion EP2 of the light emitting element LD, and the electrode layer ETL may be disposed at the first end portion EP1 of the light emitting element LD. In one or more embodiments, at least one other electrode layer may be disposed at the second end portion EP2 of the light emitting element LD.

The first semiconductor layer SCL1 may be a semiconductor layer of a first conductivity type. For example, the first semiconductor layer SCL1 may be an N-type semiconductor layer including an N-type dopant. For example, the first semiconductor layer SCL1 may include any one semiconductor material among InAlGaN, GaN, AlGaN, InGaN, AlN, and InN, and may be an N-type semiconductor layer doped with a dopant such as Si, Ge, or Sn. However, the material configuring the first semiconductor layer SCL1 is not limited thereto, and various materials in addition to the above-described materials may configure the first semiconductor layer SCL1.

The active layer ACT may be disposed on the first semiconductor layer SCL1 and may be formed in a single-quantum well or multi-quantum well structure. A position of the active layer ACT may be variously changed according to a type of the light emitting element LD. In one or more embodiments, the active layer ACT may emit light having a wavelength of 400 nm to 900 nm, and may use a double hetero-structure.

A clad layer doped with a conductive dopant may be selectively formed on and/or under the active layer ACT. For example, the clad layer may be formed of an AlGaN layer or an InAlGaN layer. According to one or more embodiments, a material such as AlGaN or AlInGaN may be used to form the active layer ACT, and various materials in addition to the above-described materials may configure the active layer ACT.

When a voltage equal to or greater than a threshold voltage is applied between both ends of the light emitting element LD, the light emitting element LD emits light while electron-hole pairs are combined in the active layer ACT. By controlling light emission of the light emitting element LD using such a principle, the light emitting element LD may be used as a light source of various light emitting devices including a pixel of a display device.

The second semiconductor layer SCL2 may be disposed on the active layer ACT and may be a semiconductor layer of a second conductive type different from that of the first semiconductor layer SCL1. For example, the second semiconductor layer SCL2 may include a P-type semiconductor layer including a P-type dopant. For example, the second semiconductor layer SCL2 may include at least one semiconductor material among InAlGaN, GaN, AlGaN, InGaN, AlN, and InN, and may be a P-type semiconductor layer doped with a dopant such as Mg. However, the material configuring the second semiconductor layer SCL2 is not limited thereto, and various materials in addition to the above-described materials may configure the second semiconductor layer SCL2.

In one or more embodiments, the first semiconductor layer SCL1 and the second semiconductor layer SCL2 may have different lengths (or thicknesses) in the length direction of the light emitting element LD. For example, the first semiconductor layer SCL1 may have a length (or a thickness) longer (or thicker) than that of the second semiconductor layer SCL2 along the length direction of the light emitting element LD. Accordingly, the active layer ACT may be positioned closer to the first end portion EP1 than the second end portion EP2.

The electrode layer ETL may be disposed on the second semiconductor layer SCL2. The electrode layer ETL may protect the second semiconductor layer SCL2, and may be an electrode for smoothly connecting the second semiconductor layer SCL2 to a desired external electrode (e.g., a predetermined electrode), line, or the like. For example, the electrode layer ETL may be an ohmic contact electrode or a Schottky contact electrode.

In describing one or more embodiments of the present disclosure, the term "connection (or coupling)" may mean a physical and/or electrical connection (or coupling) generically. In addition, this may mean a direct or indirect connection (or coupling) and an integral or non-integral connection (or coupling) generically.

The electrode layer ETL may be substantially transparent or translucent. Accordingly, light generated by the light emitting element LD may pass through the electrode layer ETL and may be emitted to the outside of the light emitting element LD. In one or more embodiments, when the light generated by the light emitting element LD does not pass through the electrode layer ETL and emitted to the outside of the light emitting element LD, the electrode layer ETL may be formed to be opaque.

In one or more embodiments, the electrode layer ETL may include metal or metal oxide. For example, the electrode layer ETL may be formed using a metal such as chromium (Cr), titanium (Ti), aluminum (Al), gold (Au), nickel (Ni), or copper (Cu), oxide or alloy thereof, a transparent conductive material such as indium tin oxide (ITO), indium zinc oxide (IZO), indium tin zinc oxide (ITZO), zinc oxide (ZnO), or indium oxide ($In_2O_3$), and the like alone or in combination.

The insulating film INF may expose the electrode layer ETL (or the second semiconductor layer SCL2) and the first semiconductor layer SCL1 (or another electrode layer provided on the second end portion EP2 of the light emitting element LD), at the first and second end portions EP1 and EP2 of the light emitting element LD, respectively.

In case that the insulating film INF is provided to cover a surface of the light emitting element LD, for example, outer surfaces (e.g., outer circumferential or peripheral surfaces) of the first semiconductor layer SCL1, the active layer ACT, the second semiconductor layer SCL2, and/or the electrode layer ETL, a short defect through the light emitting element LD may be prevented. Accordingly, electrical stability of the light emitting element LD may be secured.

In case that the insulating film INF is provided on the surface of the light emitting element LD, a surface defect of the light emitting element LD may be reduced or minimized, and thus life and efficiency may be improved. In addition, in case that the insulating film INF is formed on each light emitting element LD, even though a plurality of light emitting elements LD are disposed close to each other, occurrence of a short defect between the light emitting elements LD may be prevented.

In one or more embodiments of the present disclosure, the light emitting element LD may be manufactured through a surface treatment process. For example, the surface treatment may be performed on the light emitting element LD using a hydrophobic material so that when a plurality of light emitting elements LD are mixed in a fluid solution (or ink) and supplied to each emission area (for example, an emission area of each pixel), the light emitting elements LD may be uniformly dispersed in the solution without being un-uniformly aggregated.

The insulating film INF may include a transparent insulating material. Accordingly, light generated in the active layer ACT may pass through the insulating film INF and may be emitted to the outside of the light emitting element LD. For example, the insulating film INF may include at least one insulating material of $SiO_2$ or silicon oxide (SiOx) which is not confirmed thereto, $Si_3N_4$ or silicon nitride (SiNx) which is not confirmed thereto, $Al_2O_3$ or aluminum oxide ($Al_xO_y$) which is not confirmed thereto, and $TiO_2$ or titanium oxide ($Ti_xO_y$) which is not confirmed thereto, but is not limited thereto.

The insulating film INF may be configured of a single layer or multiple layers. For example, the insulating film INF may be formed of a double film.

In one or more embodiments, the insulating film INF may be partially etched (or removed) in at least one region, for example, a region corresponding to at least one of the first end portion EP1 and the second end portion EP2 of the light emitting element LD. For example, the insulating film INF may be etched to have a rounded shape in the at least one region, but the shape of the insulating film INF is not limited thereto.

In one or more embodiments, the light emitting element LD may have a size as small as nanometer scale to micrometer scale. For example, each light emitting element LD may have the diameter D (or a width of a cross section) and/or the length L of a nanometer scale to micrometer scale range. For example, the light emitting element LD may have the diameter D of a range of several hundred nanometers and the length L of a range of several micrometers. However, a size of the light emitting element LD may be changed.

In addition, a structure, a shape, and/or a type of the light emitting element LD may be changed according to one or more embodiments. For example, the light emitting element LD may not include the electrode layer ETL. In addition, the light emitting element LD may further include another electrode layer disposed at one end portion of the first semiconductor layer SCL1 (e.g., the second end portion EP2 of the light emitting element LD). In addition, the light emitting element LD may be formed in a core-shell structure or a structure except for the core-shell structure.

A light emitting device including the light emitting element LD may be used in various types of devices that require a light source. For example, a plurality of light emitting elements LD may be arranged in a pixel (or a sub pixel) of the display device, and the light emitting elements LD may be used as a light source of the pixel. However, an application field of the light emitting element LD is not limited to the above-described example. For example, the light emitting element LD may be used in other types of devices that require a light source, such as a lighting device.

Figure 3:
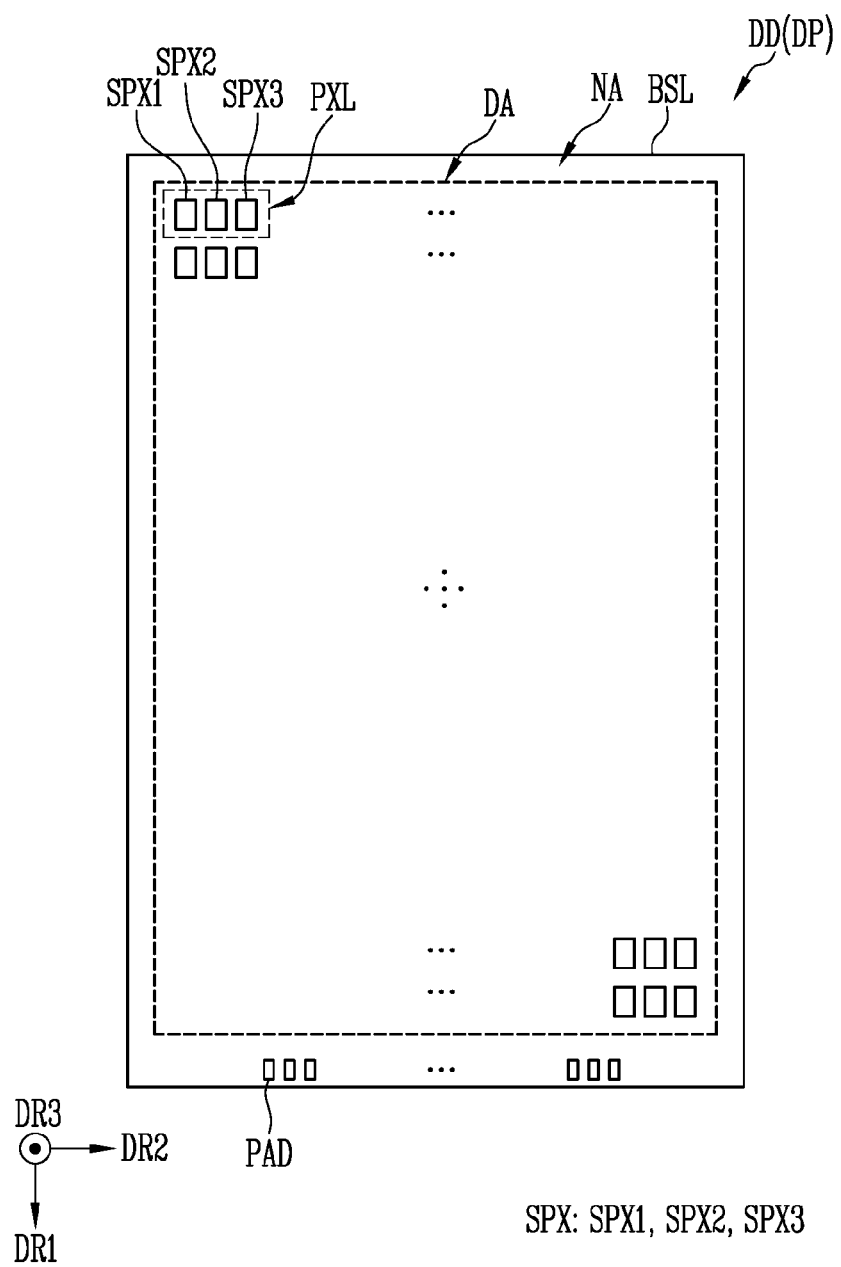
FIG. 3 is a plan view illustrating a display device according to one or more embodiments of the present disclosure.

FIG. 3 is a plan view illustrating a display device DD according to one or more embodiments of the present disclosure. In FIG. 3, a structure of the display device DD is briefly shown centering on a display panel DP including a display area DA. The display device DD may further include a driving circuit (for example, a driving circuit including a scan driver, a data driver, a timing controller, and the like) for driving the pixels PXL. In one or more embodiments, at least a portion of the driving circuit may be formed and/or disposed inside the display panel DP, and in one or more embodiments, the driving circuit may be provided outside the display panel DP.

Referring to FIG. 3, the display device DD may include a base layer BSL and the pixels PXL provided on the base layer BSL.

The base layer BSL is a base member for configuring the display panel DP, and may include the display area DA for displaying an image, and a non-display area NDA excluding the display area DA. The display area DA may configure a screen on which an image is displayed, and the non-display area NA may be the remaining area except for the display area DA on which an image is not displayed. In one or more embodiments, the non-display area NA may be around (e.g., surrounding) the display area DA along the edge or periphery of the display area DA.

The display panel DP may be provided in various shapes. For example, the display panel DP may be provided in a rectangular plate shape, but is not limited thereto. For example, the display panel DP may have a shape such as a circle or an ellipse. In addition, the display panel DP may include an angled corner and/or a curved corner.

For convenience, in FIG. 3, the display panel DP have a rectangular plate shape including. In addition, a vertical direction (a column direction of the pixels PXL, or a Y direction) of the display panel DP is indicated as a first direction DR1, a horizontal direction (a row direction of the pixels PXL, or an X direction) of the display panel DP is indicated as a second direction DR2, and a thickness direction (or a height direction) of the display panel DP is indicated as a third direction DR3.

The display area DA may have various shapes. For example, the display area DA may have various shapes including a rectangle, a circle, or an ellipse. In one or more embodiments, the display area DA may have a shape matching the shape of the display panel DP.

The pixels PXL may be arranged in the display area DA. The pixels PXL may be arranged in the display area DA along rows and columns of a matrix. For example, the display area DA may include a plurality of pixel areas in which each pixel PXL is disposed.

Each pixel PXL may include a plurality of sub pixels SPX. For example, the pixel PXL may include a first sub pixel SPX1, a second sub pixel SPX2, and a third sub pixel SPX3.

The first, second, and third sub pixels SPX1, SPX2, and SPX3 may emit light of different colors. For example, the first, second, and third sub pixels SPX1, SPX2, and SPX3 may emit red, green, and blue light, respectively. The number, type, arrangement structure, and/or the like of the sub pixels SPX configuring each pixel PXL may be variously changed according to one or more embodiments.

In one or more embodiments, each sub pixel SPX may be set as a sub pixel of a desirable color (e.g., a predetermined color), and may include a light emitting element LD that generates light of the desired color (e.g., the predetermined color). In one or more embodiments, at least some of the sub pixels SPX may include a light emitting element LD that generates light of a first color (for example, blue), and a light conversion layer for converting the light of the first color into light of a second color (for example, red or green) may be disposed on the sub pixel SPX. Accordingly, the light of the second color may be generated using the at least some of the sub pixels SPX.

Each sub pixel SPX may include at least one light source driven by a suitable control signal (e.g., a predetermined control signal) (for example, a scan signal and a data signal) and/or power (for example, first power and second power). In one or more embodiments, the light source may include the light emitting element LD according to the embodiment of FIGS. 1 and 2, for example, rod-shape light emitting element LD having a size as small as nanometer scale to micrometer scale. In addition, various types of light emitting elements may be used as the light source of the sub pixel SPX. For example, in one or more embodiments, the light source of each sub pixel SPX may be configured using a light emitting element of a core-shell structure.

The pixels PXL may have a structure according to at least one of embodiments described below. For example, the pixels PXL may have a structure in which any one of the embodiments to be described later is applied, or a structure in which at least two embodiments are applied in combination.

The non-display area NA may be disposed around the display area DA. In the non-display area NA, lines connected to the pixels PXL of the display area DA, a built-in circuit unit, and/or pads PAD may be disposed.

In one or more embodiments, the lines, the built-in circuit unit, and/or the pads PAD may be disposed only in a portion of the non-display area NA corresponding to any one of the outer sides of the display panel DP. For example, the display device DD may be formed as a single side driving display in which the lines of the display panel DP, the built-in circuit unit, and/or the pads PAD are disposed in only the non-display area NA of any one side positioned at a lower end (or an upper end) of the display area DA and the lines, the built-in circuit unit, and the pads PAD are not disposed in the remaining non-display area NA. In this case, the area of the non-display area NA may be reduced or minimized.

Figure 4:
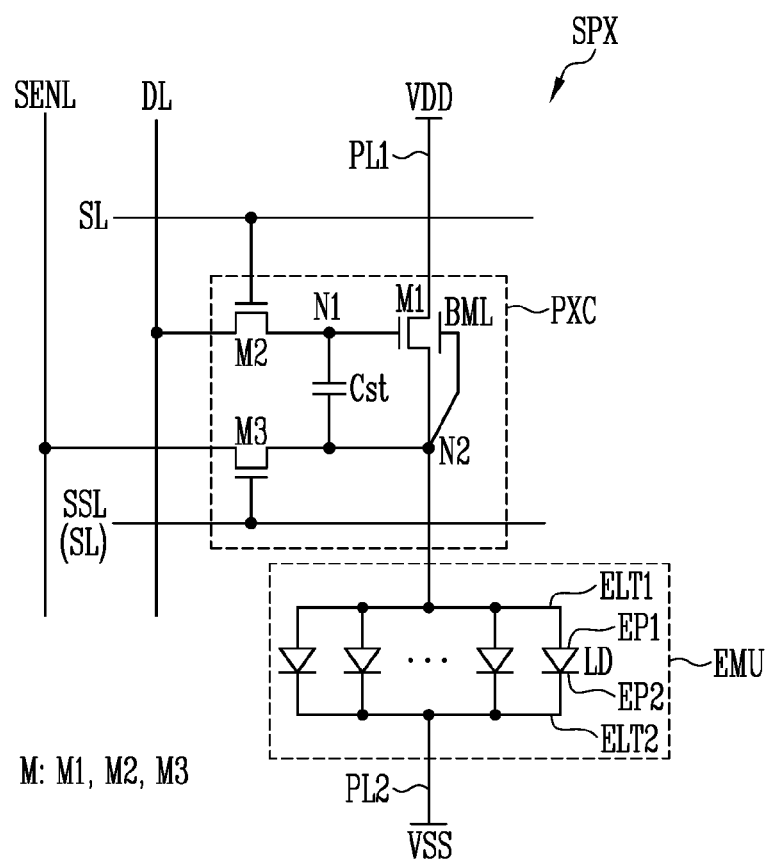
FIGS. 4 and 5 are circuit diagrams each illustrating a sub pixel according to one or more embodiments of the present disclosure.
Figure 5:
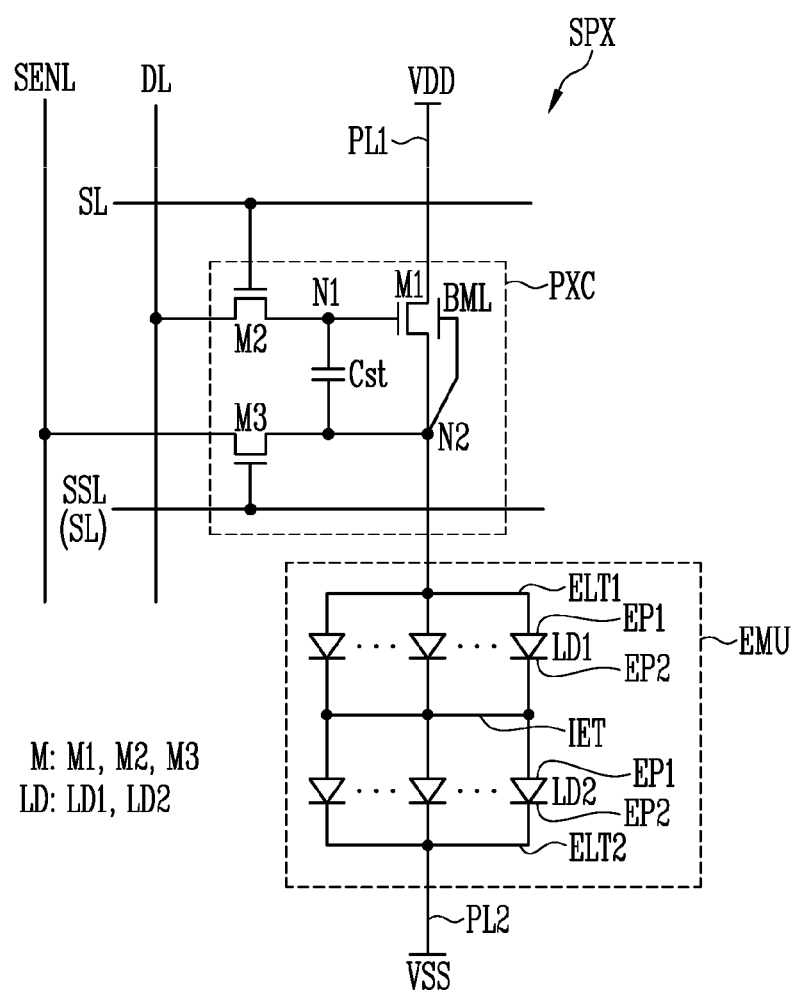

FIGS. 4 and 5 are circuit diagrams each illustrating an sub pixel SPX according to one or more embodiments of the present disclosure. For example, FIGS. 4 and 5 illustrate a sub pixels SPX including light emitting units EMU of different structures.

According to one or more embodiments, each sub pixel SPX shown in FIGS. 4 and 5 may be any one of the sub pixels SPX included in each pixel PXL of FIG. 3. In addition, the sub pixels SPX disposed in the display area DA may have substantially the same or similar structure to each other.

Referring to FIGS. 4 and 5, the sub pixel SPX may be connected to a scan line SL, a data line DL (or a sub data line), a first power line PL1, and a second power line PL2. In addition, the sub pixel SPX may be selectively further connected to at least one other power line and/or signal line.

For example, the sub pixel SPX may be further connected to a sensing line SENL and/or a control line SSL.

The sub pixel SPX may include the light emitting unit EMU for generating light of a luminance corresponding to each data signal. In addition, the sub pixel SPX may further include a pixel circuit PXC for driving the light emitting unit EMU.

The pixel circuit PXC may be connected to the scan line SL and the data line DL, and may be connected between the first power line PL1 and the light emitting unit EMU. For example, the pixel circuit PXC may be connected to the scan line SL to which a first scan signal is supplied, the data line DL to which the data signal is supplied, the first power line PL1 to which first power VDD is supplied, and a first electrode ELT1 of the light emitting unit EMU.

In addition, the pixel circuit PXC may be selectively further connected to the control line SSL to which a second scan signal is supplied, and the sensing line SENL connected to a reference power (or initialization power) or a sensing circuit in correspondence with a display period or a sensing period. In one or more embodiments, the second scan signal may be a signal that is the same as or different from the first scan signal. When the second scan signal is the signal that is the same signal as the first scan signal, the control line SSL may be integrated with the scan line SL.

The pixel circuit PXC may include at least one transistor M and a capacitor Cst. For example, the pixel circuit PXC may include a first transistor M1, a second transistor M2, a third transistor M3, and the capacitor Cst.

The first transistor M1 may be connected between the first power line PL1 and a second node N2. The second node N2 may be a node to which the pixel circuit PXC and the light emitting unit EMU are connected. For example, the second node N2 may be a node to which an electrode (for example, a source electrode) of the first transistor M1 and a first electrode ELT1 (for example, an anode electrode) of the light emitting unit EMU are connected. A gate electrode of the first transistor M1 may be connected to the first node N1. The first transistor M1 may control a driving current supplied to the light emitting unit EMU in response to a voltage at the first node N1. For example, the first transistor M1 may be a driving transistor of the sub pixel SPX.

In one or more embodiments, the first transistor M1 may further include a bottom metal layer BML (or a back gate electrode). In one or more embodiments, the bottom metal layer BML may be connected to the one electrode (for example, the source electrode) of the first transistor M1.

In one or more embodiments in which the first transistor M1 includes the bottom metal layer BML, a back-biasing technique (or sync technique) for moving a threshold voltage of the first transistor M1 in a negative direction or a positive direction by applying a back-biasing voltage to the bottom metal layer BML of the first transistor M1 may be applied. In addition, when the bottom metal layer BML is disposed under a semiconductor pattern configuring a channel of the first transistor M1, an operation characteristic of the first transistor M1 may be stabilized by blocking light incident on the semiconductor pattern.

The second transistor M2 may be connected between the data line DL and a first node N1. In addition, a gate electrode of the second transistor M2 may be connected to the scan line SL. The second transistor M2 may be turned on when the first scan signal of a gate-on voltage (for example, a high level voltage) is supplied from the scan line SL, to connect the data line DL and the first node N1.

For each frame period, a data signal of a corresponding frame may be supplied to the data line DL, and the data signal may be transmitted to the first node N1 through the second transistor M2 during a period in which the first scan signal of the gate-on voltage is supplied. For example, the second transistor M2 may be a switching transistor for transferring each data signal into the sub pixel SPX.

An electrode of the capacitor Cst may be connected to the first node N1 and another electrode may be connected to the second node N2. The capacitor Cst charges to a voltage (or holds a charge) corresponding to the data signal supplied to the first node N1 during each frame period.

The third transistor M3 may be connected between the second node N2 and the sensing line SENL. In addition, a gate electrode of the third transistor M3 may be connected to the control line SSL (or the scan line SL). The third transistor M3 may be turned on when a second scan signal (or the first scan signal) of a gate-on voltage (for example, a high level voltage) is supplied from the control line SSL, to transmit a reference voltage (or an initialization voltage) supplied to the sensing line SENL to the second node N2 or transmit a voltage of the second node N2 to the sensing line SENL. The voltage of the second node N2 transmitted to the sensing circuit through the sensing line SENL may be provided to the driving circuit (for example, the timing controller), and may be used to compensate for a characteristic deviation of the pixels PXL (or the sub pixels SPX).

In FIGS. 4 and 5, all of the transistors M included in the pixel circuit PXC are N-type transistors, but the present disclosure is not limited thereto. For example, at least one of the first, second, and third transistors M1, M2, and M3 may be changed to a P-type transistor. In addition, a structure and a driving method of the sub pixel SPX may be variously changed according to one or more embodiments.

The light emitting unit EMU may include the first electrode ELT1, a second electrode ELT2, and at least one light emitting element LD, which are connected between the first power VDD and second power VSS. For example, the light emitting unit EMU may include the first electrode ELT1 connected to the first power VDD through the pixel circuit PXC and/or the first power line PL1, the second electrode ELT2 connected to the second power VSS through the second power line PL2, and at least one light emitting element LD connected between the first electrode ELT1 and the second electrode ELT2.

The first power VDD and the second power VSS may have different potentials. For example, the first power VDD may be a high potential pixel power, and the second power VSS may be a low potential pixel power. A potential difference between the first power VDD and the second power VSS may be equal to or greater than a threshold voltage of the light emitting elements LD.

In one or more embodiments, the light emitting unit EMU may include a plurality of light emitting elements LD connected in parallel in a forward direction between the first electrode ELT1 and the second electrode ELT2 as shown in FIG. 4. For example, the first end portions EP1 of the light emitting elements LD may be connected to the first electrode ELT1, and the second end portions EP2 of the light emitting elements LD may be connected to the second electrode ELT2. In one or more embodiments, the sub pixel SPX may include a plurality of light emitting elements LD connected only in series between the first electrode ELT1 and the second electrode ELT2, or include only a single light emitting element LD connected in the forward direction between the first electrode ELT1 and the second electrode ELT2.

In one or more embodiments, the light emitting unit EMU may include a plurality of light emitting elements LD connected in series-parallel between the first electrode ELT1 and the second electrode ELT2 as shown in FIG. 5. When the light emitting unit EMU includes a plurality of light emitting elements LD divided and arranged in at least two serial stages, the light emitting unit EMU may further include at least one intermediate electrode IET connected between the first electrode ELT1 and the second electrode ELT2. For example, the light emitting unit EMU may include the first electrode ELT1, the intermediate electrode IET, and the second electrode ELT2 sequentially connected between the pixel circuit PXC and the second power line PL2. In addition, the light emitting unit EMU may include a plurality of light emitting elements LD including at least one first light emitting element LD1 (for example, a plurality of first light emitting elements LD1) connected in a forward direction between the first electrode ELT1 and the intermediate electrode IET, and at least one second light emitting element LD2 (for example, a plurality of second light emitting elements LD2) connected in the forward direction between the intermediate electrode IET and the second electrode ELT2. For example, the first end portions EP1 and the second end portions EP2 of the first light emitting elements LD1 may be respectively connected to the first electrode ELT1 and the intermediate electrode IET, and the first end portions EP1 and the second end portions EP2 of the second light emitting element LD2 may be respectively connected to the intermediate electrode IET and the second electrode ELT2.

Each light emitting element LD may configure each effective light source. Such effective light sources may be gathered to configure a light source of the sub pixel SPX.

The light emitting elements LD may emit light with a luminance corresponding to a driving current supplied through the pixel circuit PXC. During each frame period, the pixel circuit PXC may supply a driving current corresponding to the data signal to the light emitting unit EMU. The driving current supplied to the light emitting unit EMU may be divided and flowed through the light emitting elements LD. Accordingly, each light emitting element LD may emit light with a luminance corresponding to the current flowing therethrough, and the light emitting unit EMU may emit light with a luminance corresponding to the driving current.

In FIGS. 4 and 5, only the light emitting elements LD (that is, effective light sources) connected in the forward direction between the first electrode ELT1 and the second electrode ELT2 are shown, but the present disclosure is not limited thereto. For example, the light emitting unit EMU may further include at least one ineffective light source in addition to the light emitting elements LD configuring each effective light source. For example, the light emitting unit EMU may further include at least one ineffective light emitting element arranged in a reverse direction between the first electrode ELT1 and the second electrode ELT2, or having at least one floated end portion.

Figure 6:
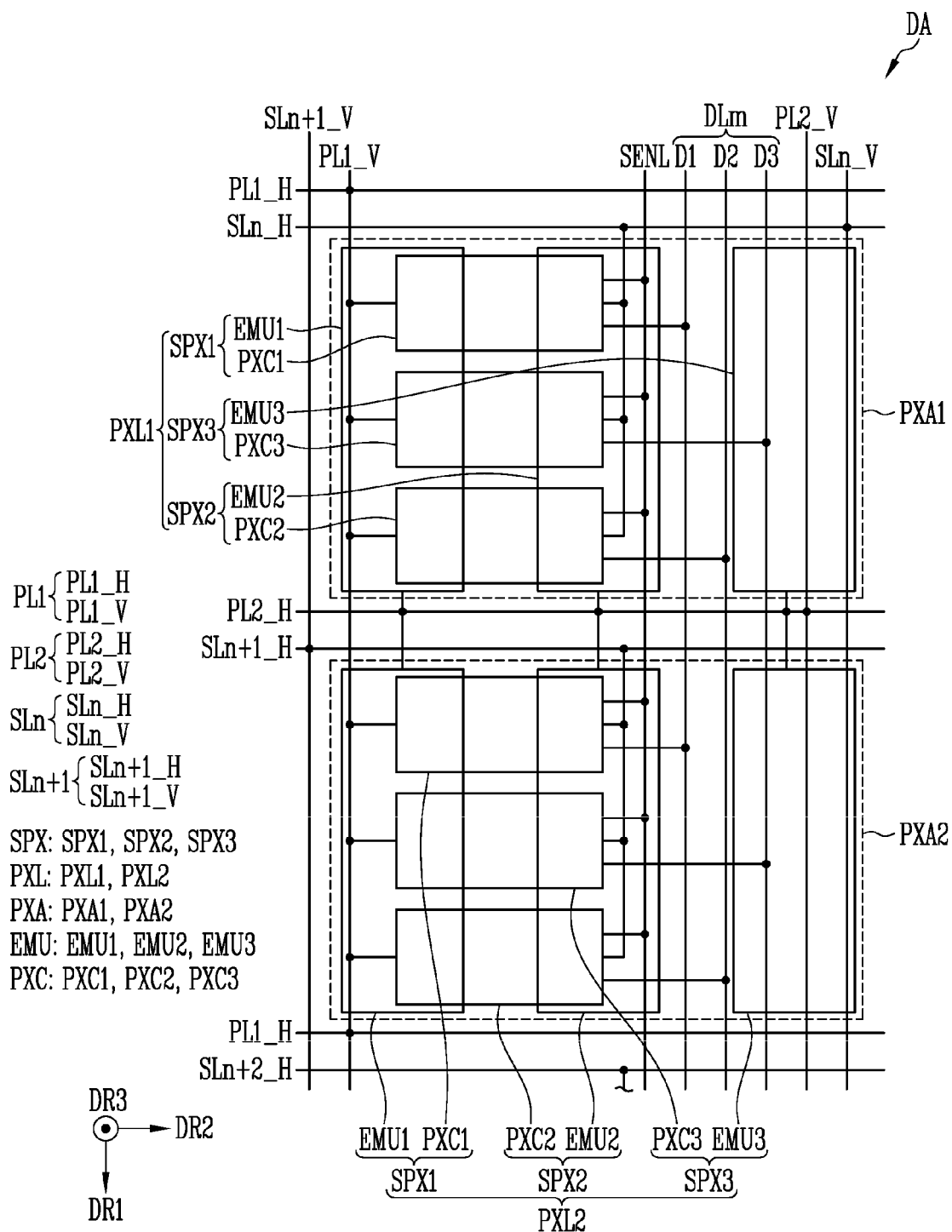
FIG. 6 is a plan view illustrating a display area according to one or more embodiments of the present disclosure.

FIG. 6 is a plan view illustrating the display area DA according to one or more embodiments of the present disclosure. FIG. 6 schematically shows a structure of the display area DA, centering on a first pixel PXL1 and a second pixel PXL2 sequentially arranged in the display area DA along the first direction DR1. For example, the first pixel PXL1 may be disposed on an n-th (n is a natural number) horizontal line (for example, an n-th pixel row) and an m-th (m is a natural number) vertical line (for example, an m-th pixel column) of the display area DA, and the second pixel PXL2 may be disposed on an (n+1)-th horizontal line (for example, an (n+1)-th pixel row) and the m-th vertical line of the display area DA. That is, the first pixel PXL1 and the second pixel PXL2 may be disposed at the same vertical line in the display area DA, and may be vertically adjacent to each other along the first direction DR1.

Referring to FIGS. 3-6, the display area DA may include the plurality of pixels PXL including the first pixel PXL1 and the second pixel PXL2, the scan lines SL connected to the pixels PXL, the data lines DL, the sensing lines SENL, the first power line PL1, and the second power line PL2. In one or more embodiments, the control line SSL of each horizontal line may be integrated with the scan line SL of a corresponding horizontal line.

The scan lines SL may be formed for each horizontal line of the pixels or the subpixels. Each scan line SL may be connected to the pixel circuits PXC of the sub pixels SPX disposed on the corresponding horizontal line.

In one or more embodiments, each scan line SL may include a plurality of sub scan lines each extending in the first direction DR1 and the second direction DR2 in the display area DA. For example, an n-th scan line SLn may include a first sub scan line SLn_H disposed on the n-th horizontal line of the display area DA and extending in the second direction DR2, and a second sub scan line SLn_V extending in the first direction DR1 in the display area DA to cross the first sub scan line SLn_H and connected to the first sub scan line SLn_H. Similarly, the (n+1)-th scan line SLn+1 may include a first sub scan line SLn+1_H disposed on the (n+1)-th horizontal line of the display area DA and extending in the second direction DR2, and a second sub scan line SLn+1_V extending in the first direction DR1 in the display area DA to cross the first sub scan line SLn+1_H and connected to the first sub scan line SLn+1_H.

As described above, when the scan lines SL are formed to extend in the first direction DR1 and the second direction DR2, a position of the pads PAD and/or the driving circuit (for example, the scan driver) may be freely changed. For example, even though the display device DD is a short side driving type display device, each scan signal may be supplied to the pixels PXL in a horizontal line unit.

The data lines DL may extend in the first direction DR1 in the display area DA, and may be formed for each vertical line of the pixels or the subpixels. However, the present disclosure is not limited thereto. For example, the data lines DL may be formed for each of two adjacent vertical lines of the pixels or the subpixels, and the two vertical lines of the pixels or the subpixels may share the data lines DL. In this case, by separating the scan lines SL connected to the pixels PXL of the two vertical lines, the time at which the data signal is input to the pixels PXL may be divided. In other words, adjacent two vertical pixel lines may be driven in a time division multiplexed manner.

Each data line DL may be connected to the pixel circuits PXC of the sub pixels SPX disposed on a corresponding vertical line. In addition, each data line DL may include a plurality of sub data lines individually connected to the sub pixels SPX configuring each pixel PXL. For example, an m-th data line DLm may include a first sub data line D1 connected to first sub pixels SPX1 of the pixels PXL disposed on the m-th vertical line, a second sub data line D2 connected to second sub pixels SPX2 of the pixels PXL disposed on the m-th vertical line, and a third sub data line D3 connected to the third sub pixels SPX3 of the pixels PXL disposed on the m-th vertical line. Accordingly, the data signal may be individually supplied to each sub pixel SPX.

The sensing lines SENL may extend in the first direction DR1 in the display area DA, and may be formed for each of at least one vertical line of the pixels or the subpixels. In one or more embodiments, the sensing lines SENL may be formed for each vertical line and may be commonly connected to the sub pixels SPX configuring each pixel PXL. In this case, a characteristic of each pixel PXL may be individually detected. In one or more embodiments, the sensing lines SENL may be formed so that a plurality of vertical lines are shared. In this case, a characteristic of the pixels PXL may be detected in a block unit including the plurality of pixels PXL.

The first power line PL1 and the second power line PL2 may be commonly connected to the pixels PXL of the display area DA. For example, the first power line PL1 may be commonly connected to the pixel circuits PXC of the sub pixels SPX, and the second power line PL2 may be commonly connected to the light emitting units EMU of the sub pixels SPX.

In one or more embodiments, each of the first power line PL1 and the second power line PL2 may be formed in a mesh shape to prevent or minimize a voltage drop (IR drop) of the first power VDD and the second power VSS. Accordingly, the first power VDD and the second power VSS of a uniform level may be transmitted to the pixels PXL.

For example, the first power line PL1 may include at least one (1-1)-th sub power line PL1_V extending in the first direction DR1 in the display area DA, and at least one (1-2)-th sub power line PL1_H extending in the second direction DR2 in the display area DA and connected to the (1-1)-th sub power line PL1_V. The at least one (1-1)-th sub power line PL1_V and the at least one (1-2)-th sub power line PL1_H may cross each other, and may be connected to each other at all cross points or some of cross points.

Similarly, the second power line PL2 may include at least one (2-1)-th sub power line PL2_V extending in the first direction DR1 in the display area DA, and at least one (2-2)-th sub power line PL2_H extending in the second direction DR2 in the display area DA and connected to the (2-1)-th sub power line PL2_V. The at least one (2-1)-th sub power line PL2_V and the at least one (2-2)-th sub power line PL2_H may cross each other, and may be connected to each other at all cross points or some of cross points.

In one or more embodiments, the (1-1)-th sub power line PL1_V and the (2-1)-th sub power line PL2_V may be formed for each of at least one vertical line of the pixels or the subpixels. For example, the (1-1)-th sub power line PL1_V and the (2-1)-th sub power line PL2_V may be formed for each vertical line, and may be spaced from each other with the pixel circuits PXC arranged in the pixel column of the corresponding vertical line interposed therebetween. The number, position, and/or the like of the (1-1)-th sub power line PL1_V and the (2-1)-th sub power line PL2_V may be variously changed according to one or more embodiments.

In one or more embodiments, the (1-2)-th sub power line PL1_H and the (2-2)-th sub power line PL2_H may be formed for each one horizontal line or each of a plurality of horizontal lines. For example, the (1-2)-th sub power line PL1_H and the (2-2)-th sub power line PL2_H may be alternately arranged in the display area DA along the first direction DR1 with the pixels PXL disposed at each horizontal line interposed therebetween. For example, the (1-2)-th sub power line PL1_H may be positioned in an upper area of a pixel row positioned at an odd-numbered horizontal line, the (2-2)-th sub power line PL2_H may be positioned at an upper area of a pixel row positioned at an even-numbered horizontal line, and a pair of adjacent (1-2)-th sub power line PL1_H and (2-2)-th sub power line PL2_H may be spaced from each other with the pixel circuits PXC arranged in the pixel row of each horizontal line interposed therebetween.

For example, any one (1-2)-th sub power line PL1_H may be disposed in an upper region of the first pixel PXL1 (for example, a periphery of the first sub scan line SLn_H of the n-th scan line SLn), any one (2-2)-th sub power line PL2_H may be disposed between the first pixel PXL1 and the second pixel PXL2 (for example, a periphery of the first sub scan line SLn+1_H of the (n+1)-th scan line SLn+1), and any one (1-2)-th sub power line PL1_H may be disposed in a lower region of the second pixel PXL2 (for example, a periphery of the first sub scan line SLn+2_H of an (n+2)-th scan line). The number, position, and/or the like of the (1-2)-th sub power line PL1_H and the (2-2)-th sub power line PL2_H may be variously changed according to one or more embodiments.

Each pixel PXL may include the plurality of sub pixels SPX. For example, each pixel PXL may include the first sub pixel SPX1, the second sub pixel SPX2, and the third sub pixel SPX3.

The respective sub pixels SPX may include respective pixel circuits PXC and light emitting units EMU. For example, the first sub pixel SPX1 may include a first pixel circuit PXC1 and a first light emitting unit EMU1, the second sub pixel SPX2 may include a second pixel circuit PXC2 and a second light emitting unit EMU2, and the third sub pixel SPX3 may include a third pixel circuit PXC3 and a third light emitting unit EMU3.

The pixel circuits PXC and the light emitting units EMU of each pixel PXL may be disposed at different layers and may overlap each other in the third direction DR3. For example, the pixel circuits PXC may be disposed at a pixel circuit layer (for example, PCL of FIGS. 7-9) of the pixel area PXA in which each pixel PXL is disposed. In addition, the light emitting units EMU may be disposed at a display layer (for example, DPL of FIGS. 7-9) of each pixel area PXA to overlap the pixel circuits PXC of the corresponding pixel PXL, and/or at least one line (for example, at least one scan line SL, sensing line SENL, and data line DL (or the sub data line), first power line PL1, and/or second power line PL2) in the third direction DR3.

The first, second, and third pixel circuits PXC1, PXC2, and PXC3 may be arranged along the first direction DR1 in each pixel area PXA. For example, the first, second, and third pixel circuits PXC1, PXC2, and PXC3 of the first pixel PXL1 may be arranged along the first direction DR1 in a suitable order (e.g., a predetermined order) in the first pixel area PXA1 in which the first pixel PXL1 is provided. Similarly, the first, second, and third pixel circuits PXC1, PXC2, and PXC3 of the second pixel PXL2 may be arranged along the first direction DR1 in a suitable order (e.g., a predetermined order) in the second pixel area PXA2 in which the second pixel PXL2 is provided.

In one or more embodiments, the third pixel circuit PXC3 may be positioned at a center of each pixel area PXA in the first direction DR1, and the first and second pixel circuits PXC1 and PXC2 may be disposed on both sides of the third pixel circuit PXC3 in the first direction DR1. However, a position and/or an arrangement order of the first, second, and third pixel circuits PXC1, PXC2, and PXC3 may be changed according to one or more embodiments.

The first, second, and third pixel circuits PXC1, PXC2, and PXC3 may be commonly connected to the first power line PL1 and the scan line SL of the corresponding horizontal line, and may be connected to different sub data lines of the corresponding vertical line. For example, the first pixel circuit PXC1 may be connected to a first sub data line D1, the second pixel circuit PXC2 may be connected to a second sub data line D2, and the third pixel circuit PXC3 may be connected to a third sub data line D3.

In addition, the first, second, and third pixel circuits PXC1, PXC2, and PXC3 may be further selectively connected to the sensing line SENL. For example, the first, second, and third pixel circuits PXC1, PXC2, and PXC3 may be commonly connected to the sensing line SENL of the corresponding vertical line.

The first, second, and third light emitting units EMU1, EMU2, and EMU3 may be connected between each pixel circuit PXC and the second power line PL2. For example, the first, second, and third light emitting units EMU1, EMU2, and EMU3 may be connected to the first, second, and third pixel circuits PXC1, PXC2, and PXC3, respectively, through each first contact hole (for example, CH1 of FIGS. 10-12). In addition, the first, second, and third light emitting units EMU1, EMU2, and EMU3 may be connected to any one (2-2)-th sub power line PL2_H through each second contact hole (for example, CH2 of FIGS. 10-12) and/or fourth contact hole (for example, CH4 of FIGS. 10-12).

The first, second, and third light emitting units EMU1, EMU2, and EMU3 may be arranged along the second direction DR2 in each pixel area PXA. For example, the first, second, and third light emitting units EMU1, EMU2, and EMU3 of the first pixel PXL1 may be arranged sequentially along the second direction DR2 in the first pixel area PXA1 in which the first pixel PXL1 is provided. Similarly, the first, second, and third light emitting units EMU1, EMU2, and EMU3 of the second pixel PXL2 may be arranged sequentially along the second direction DR2. The first, second, and third sub pixels SPX1, SPX2, and SPX3 may have emission areas corresponding to one region (or a portion) of the first, second, and third light emitting units EMU1, EMU2, and EMU3, respectively. Accordingly, the emission areas of the first, second, and third sub pixels SPX1, SPX2, and SPX3 may be sequentially arranged along the second direction DR2.

The first, second, and third light emitting units EMU1, EMU2, and EMU3 may or may not overlap at least one signal line (for example, each scan line SL, data line DL and/or sensing line SENL) and/or at least one power line (for example, the first power line PL1 and/or the second power line PL2). For example, the third light emitting unit EMU3 may overlap the third sub data line D3, the (2-1)-th sub power line PL2_V, and/or the second sub scan line SLn_V of the corresponding vertical line.

Although FIG. 6 discloses an embodiment in which the pixel circuits PXC and the light emitting units EMU of the sub pixels SPX are arranged in different directions in the pixel area PXA in which each pixel PXL is provided, the present disclosure is not limited thereto. For example, a position, an arrangement direction, and/or the like of the pixel circuits PXC and the light emitting units EMU may be variously changed according to one or more embodiments.

Figure 7:
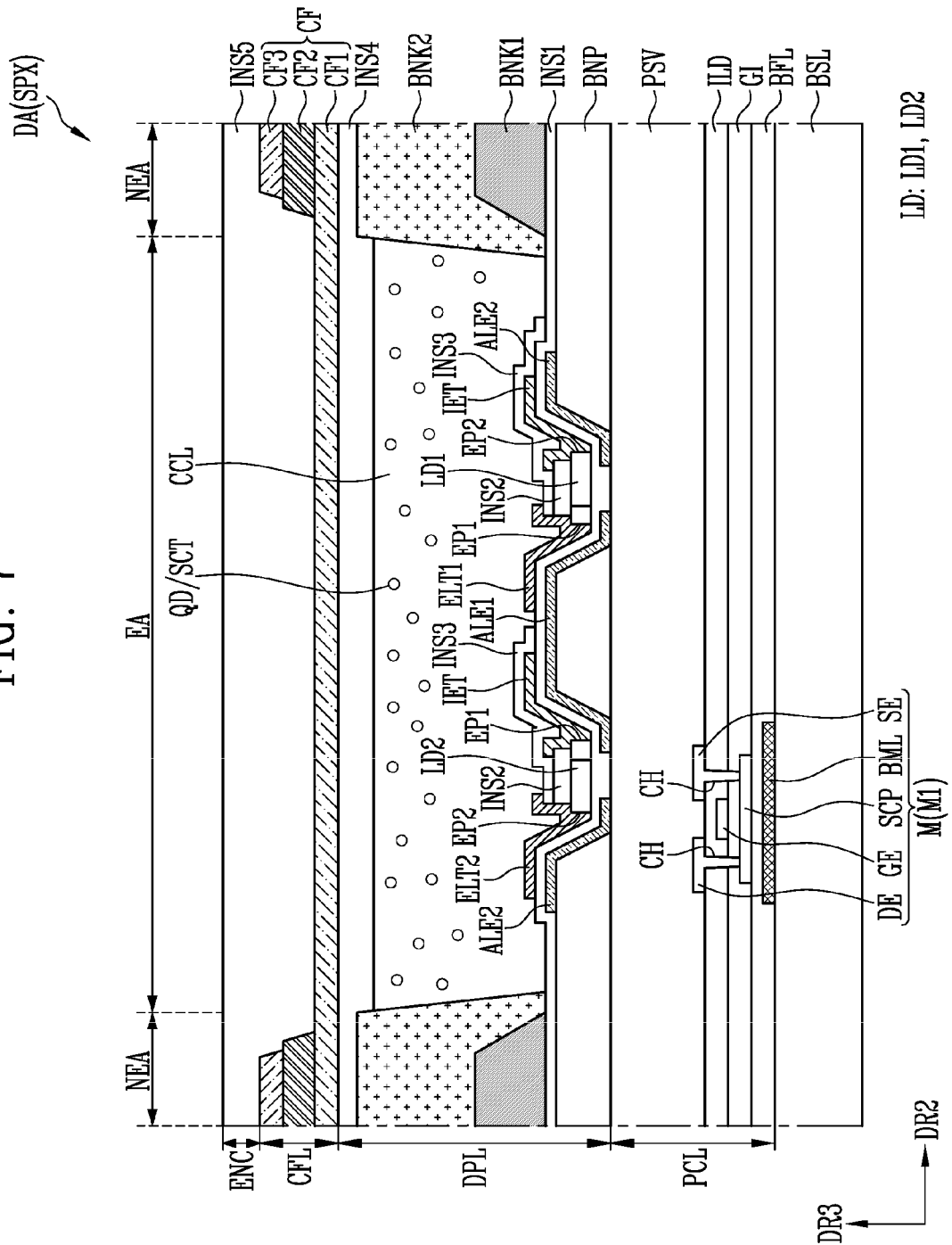
FIGS. 7-9 are cross-sectional views each illustrating a display area according to one or more embodiments of the present disclosure.
Figure 8:
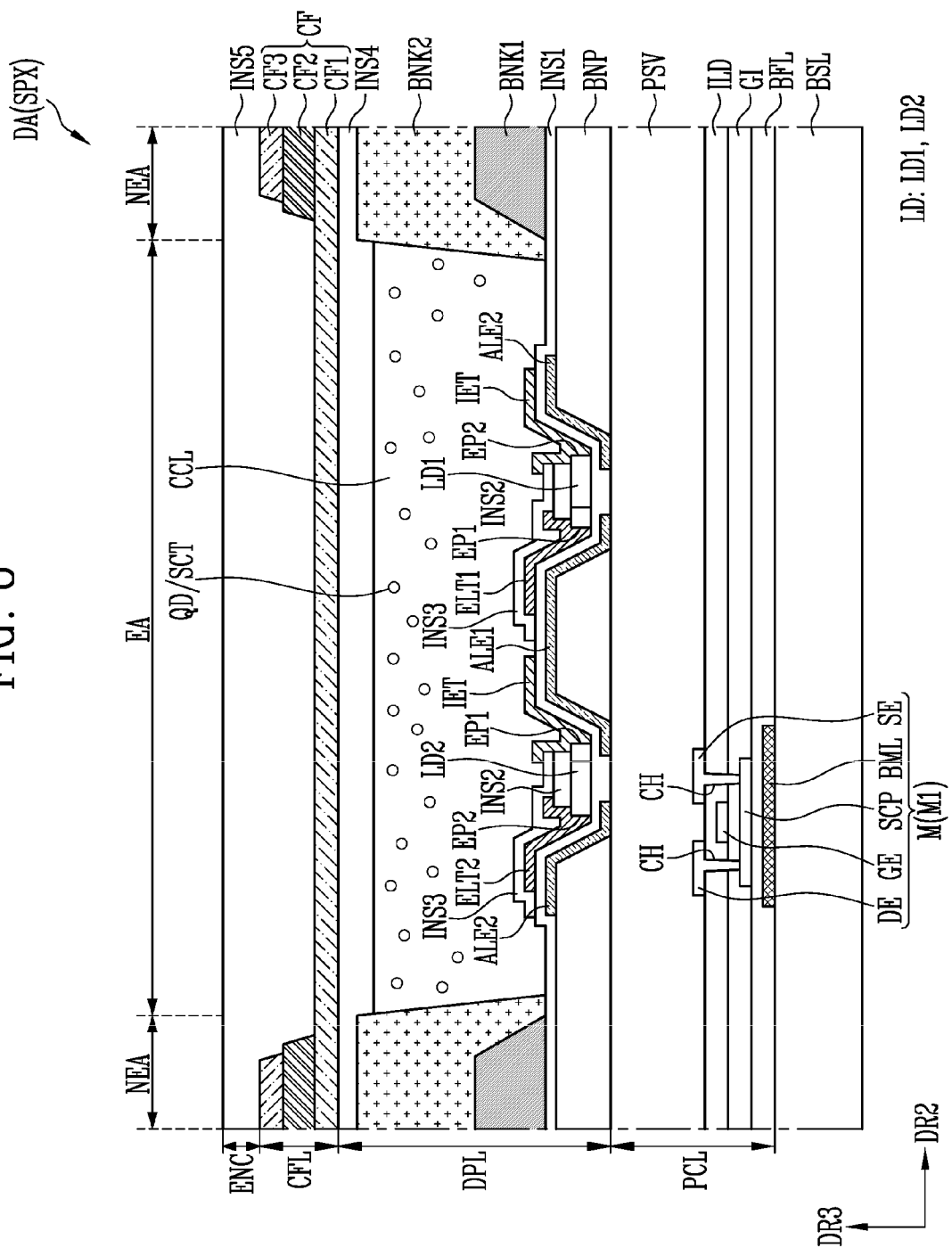
Figure 9:
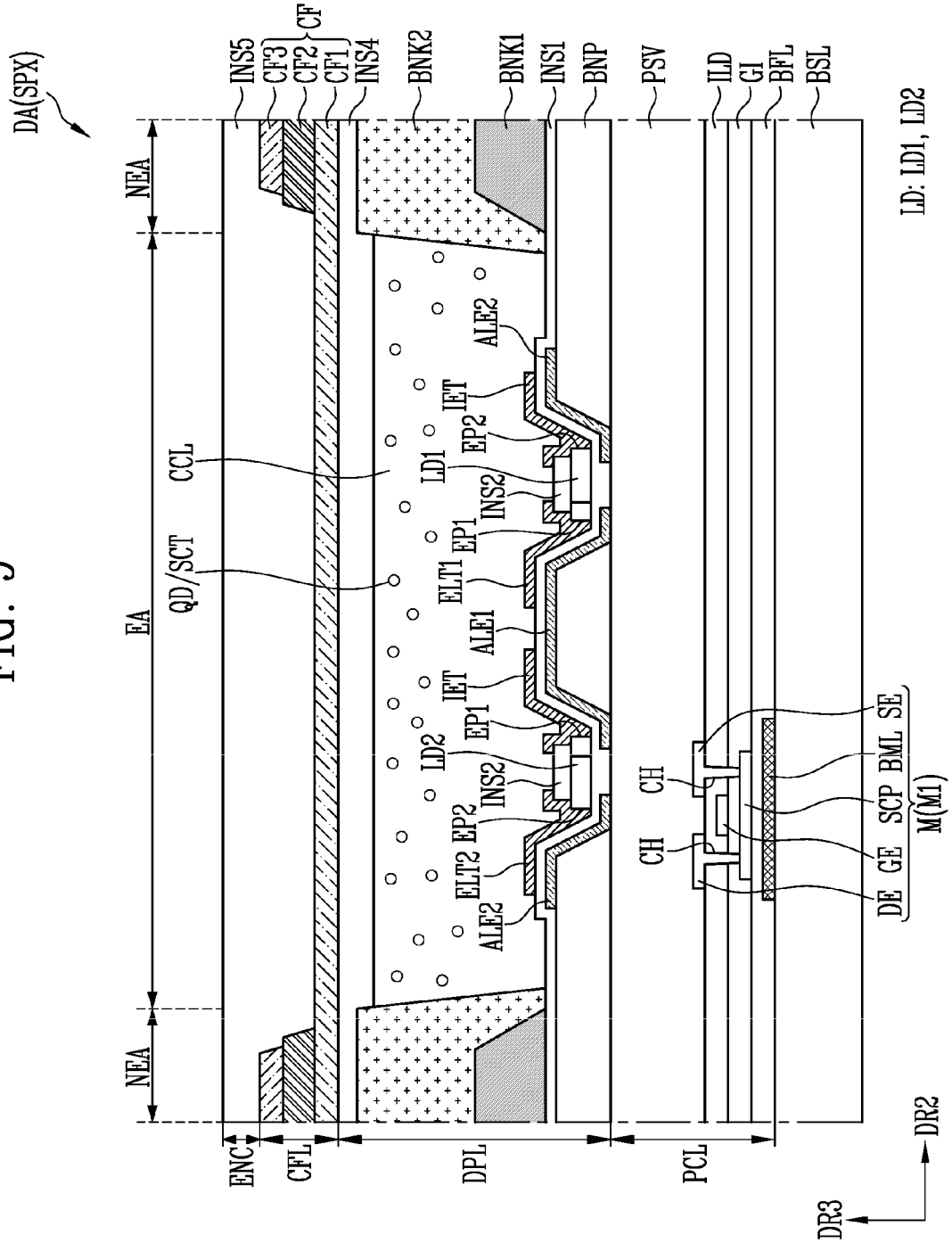

FIGS. 7-9 are cross-sectional views each illustrating the display area DA according to one or more embodiments of the present disclosure. For example, FIGS. 7-9 schematically show a cross section of the display area DA centering on any one sub pixel SPX including the first and second electrodes ELT1 and ELT2, the intermediate electrode IET, and the first and second light emitting elements LD1 and LD2 as in the embodiment of FIG. 5. FIGS. 7-9 illustrate a cross section of the sub pixel SPX according to one or more embodiments in relation to a mutual position of the first and second electrodes ELT1 and ELT2, and the intermediate electrode IET.

FIGS. 7-9 illustrate a cross section of any one transistor M (for example, the first transistor M1 including the bottom metal layer BML) provided in each pixel circuit PXC, as an example of the circuit elements that may be disposed at the pixel circuit layer PCL of the display area DA. In addition to the circuit elements provided in each pixel circuit PXC, various signal lines and/or power lines may further be disposed at the pixel circuit layer PCL. In addition, FIGS. 7-9 illustrate a cross section of the light emitting unit EMU including the light emitting element LD1 and the second light emitting element LD2 as an example of the light emitting unit EMU that may be disposed on the display layer DPL of the display area DA, as in the embodiment of FIG. 5.

The sub pixels SPX disposed in the display area DA may have substantially similar cross-sectional structures. However, a size, a position, a shape, and/or the like of the circuit elements configuring the sub pixels SPX and electrodes included in the circuit elements may be different for each sub pixel SPX. For example, in a plan view, the first transistor M1 of the first sub pixel SPX1 may have a shape different from that of the first transistor M1 of the second sub pixel SPX2.

Referring to FIGS. 1-9, the display panel DP may include the base layer BSL, the pixel circuit layer PCL, and the display layer DPL. The pixel circuit layer PCL and the display layer DPL may be disposed to overlap each other on the base layer BSL in the third direction DR3. For example, the pixel circuit layer PCL and the display layer DPL may be sequentially disposed on one surface of the base layer BSL.

In addition, the display panel DP may further include a color filter layer CFL and/or an encapsulation layer ENC (or a protective layer) disposed on the display layer DPL. In one or more embodiments, the color filter layer CFL and/or the encapsulation layer ENC may be formed directly on one surface of the base layer BSL on which the pixel circuit layer PCL and the display layer DPL are formed, but is not limited thereto.

The base layer BSL may be a rigid substrate or a flexible substrate or film, and a material or a structure thereof is not particularly limited. For example, the base layer BSL may include at least one transparent or opaque insulating material, and may be a substrate or a film of a single layer or multiple layers.

The pixel circuit layer PCL may be provided on one surface of the base layer BSL. The pixel circuit layer PCL may include the circuit elements configuring the pixel circuits PXC (for example, the first, second, and third pixel circuits PXC1, PXC2, and PXC3) of each pixel PXL. For example, a plurality of circuit elements including the first transistors M1 of the first, second, and third pixel circuits PXC1, PXC2, and PXC3 may be formed in each pixel area PXA of the pixel circuit layer PCL.

In addition, the pixel circuit layer PCL may include various signal lines and power lines connected to the pixels PXL. For example, the pixel circuit layer PCL may include the scan lines SL, the data lines DL, the sensing lines SENL, and the first and second power lines PL1 and PL2.

Additionally, the pixel circuit layer PCL may include a plurality of insulating layers. For example, the pixel circuit layer PCL may include a buffer layer BFL, a gate insulating layer GI, an interlayer insulating layer ILD, and/or a passivation layer PSV sequentially disposed on one surface of the base layer BSL.

The pixel circuit layer PCL may be disposed on the base layer BSL, and may include a first conductive layer including the bottom metal layers BML of the first transistors M1. For example, the first conductive layer may be disposed between the base layer BSL and the buffer layer BFL, and include the bottom metal layers BML of the first transistors M1 included in the sub pixels SPX. The bottom metal layers BML of the first transistors M1 may overlap the gate electrodes GE and the semiconductor patterns SCP of the first transistors M1 in the third direction DR3.

In addition, the first conductive layer may further include one or more lines (e.g., predetermined lines). For example, the first conductive layer may include at least some of the lines extending in the first direction DR1 in the display area DA. For example, the first conductive layer may include the second sub scan lines (for example, SLn_V and SLn+1_V of FIG. 6), the (1-1)-th sub power lines PL1_V, the sensing lines SENL, the data lines DL, and the (2-1)-th sub power lines PL2_V.

The buffer layer BFL may be disposed on one surface of the base layer BSL including the first conductive layer. The buffer layer BFL may prevent diffusion of an impurity into each of the circuit elements.

The semiconductor layer may be disposed on the buffer layer BFL. The semiconductor layer may include the semiconductor patterns SCP of the transistors M. Each semiconductor pattern SCP may have a channel region overlapping the gate electrode GE of the corresponding transistor M in the third direction DR3, and first and second conductive regions (for example, source and drain regions) disposed on both sides of the channel region. Each semiconductor pattern SCP may be a semiconductor pattern formed of polysilicon, amorphous silicon, oxide semiconductor, or the like.

The gate insulating layer GI may be disposed on the semiconductor layer. In addition, a second conductive layer may be disposed on the gate insulating layer GI.

The second conductive layer may include the gate electrodes GE of the transistors M. In addition, the second conductive layer may further include one electrode of each of the capacitors Cst, bridge patterns, and/or the like provided in the pixel circuits PXC. Additionally, when at least one power line and/or signal line (for example, the second sub scan lines) disposed in the display area DA is configured of multiple layers, the second conductive layer may further include at least one conductive pattern configuring the at least one power line and/or signal line.

The interlayer insulating layer ILD may be disposed on the second conductive layer. In addition, a third conductive layer may be disposed on the interlayer insulating layer ILD.

The third conductive layer may include source electrodes SE and drain electrodes DE of the corresponding transistor M. Each source electrode SE may be connected to one region (for example, the source region) of the semiconductor pattern SCP included in the corresponding transistor M through at least one contact hole CH penetrating through the interlayer insulating layer ILD and the gate insulating layer GI, and each drain electrode DE may be connected to another region (for example, the drain region) of the semiconductor pattern SCP included in the corresponding transistor M through at least one other contact hole CH penetrating through the interlayer insulating layer ILD and the gate insulating layer GI. In addition, the third conductive layer may further include one electrode of each of the capacitors Cst, one or more lines (e.g., predetermined lines), and/or the bridge patterns provided in the pixel circuits PXC. For example, the third conductive layer may include at least some of the lines extending in the second direction DR2 in the display area DA. For example, the third conductive layer may include the first sub scan lines (for example, SLn_H, SLn+1_H, and SLn+2_H of FIG. 6), the (1-2)-th sub power lines PL1_H, and the (2-2)-th sub power lines PL2_H. Additionally, when at least one power line and/or signal line (for example, the second sub scan lines) disposed in the display area DA is configured of multiple layers, the third conductive layer may further include at least one conductive pattern configuring the at least one power line and/or signal line.

In each conductive pattern, electrodes and/or lines configuring (e.g., constituting or that are parts of) the first to third conductive layers may have conductivity due to at least one conductive material being included in the first to third conductive layers, and a configuration material thereof is not particularly limited. For example, each conductive pattern, electrode and/or line configuring the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of conductive materials.

The passivation layer PSV may be disposed on the third conductive layer. Each of the buffer layer BFL, the gate insulating layer GI, the interlayer insulating layer ILD, and the passivation layer PSV may be configured of a single layer or multiple layers, and may include at least one inorganic insulating material and/or organic insulating material. For example, each of the buffer layer BFL, the gate insulating layer GI, the interlayer insulating layer ILD, and the passivation layer PSV may include various types of organic/inorganic insulating materials including silicon nitride ($SiN_x$), silicon oxide ($SiO_x$), silicon oxynitride ($SiO_xN_y$), and the like. In one or more embodiments, the passivation layer PSV may include an organic insulating layer and may planarize a surface of the pixel circuit layer PCL.

The display layer DPL may be disposed on the passivation layer PSV.

The display layer DPL may include the light emitting units EMU of the sub pixels SPX. For example, the display layer DPL may include the first and second alignment electrodes ALE1 and ALE2, at least one light emitting element LD, and the first and second electrodes ELT1 and ELT2 disposed in the emission area EA of each sub pixel SPX. In one or more embodiments, each light emitting unit EMU may include the plurality of light emitting elements LD as shown in FIGS. 4 and 5.

In addition, the display layer DPL may further include insulating patterns and/or insulating layers sequentially disposed on one surface of the base layer BSL on which the pixel circuit layer PCL is formed. For example, the display layer DPL may include bank patterns BNP, a first insulating layer INS1, a first bank BNK1, a second insulating layer INS2, a third insulating layer INS3, a second bank BNK2, and a fourth insulating layer INS4. In addition, the display layer DPL may selectively further include a light conversion layer CCL.

The bank patterns BNP (also referred to as "patterns" or "wall patterns") may be provided and/or formed on the passivation layer PSV. In one or more embodiments, the bank patterns BNP may be formed in separation type patterns individually disposed under the first and second alignment electrodes ALE1 and ALE2 so as to overlap a portion of each of the first and second alignment electrodes ALE1 and ALE2 in the third direction DR3. Alternatively, the bank patterns BNP may be formed in an integral pattern having an opening portion or a concave portion corresponding to regions between the first and second alignment electrodes ALE1 and ALE2 in the emission regions EA of the sub pixels SPX and entirely connected in the display area DA. For example, the bank patterns BNP may have the opening portions or the concave portions corresponding to each area (for example, a light emitting element array area in which light emitting elements configuring each serial stage of the light emitting unit EMU are arranged) in which the light emitting elements LD are arranged, so as to be around (e.g., surround) at least some light emitting elements LD disposed in the emission area EA of each of the sub pixels SPX.

The first and second alignment electrodes ALE1 and ALE2 may protrude in an upper direction (for example, in the third direction DR3) around the light emitting elements LD by the bank patterns BNP. The bank patterns BNP and the first and second alignment electrodes ALE1 and ALE2 thereon may form a reflective protrusion pattern around the light emitting elements LD. Accordingly, light efficiency of the sub pixels SPX may be improved.

The bank patterns BNP may include an inorganic insulating layer formed of an inorganic material or an organic insulating layer formed of an organic material. In addition, the bank patterns BNP may be formed of a single layer or multiple layers. The first and second alignment electrodes ALE1 and ALE2 of the light emitting units EMU may be formed on the bank patterns BNP.

The first and second alignment electrodes ALE1 and ALE2 may include at least one conductive material. For example, the first and second alignment electrodes ALE1 and ALE2 may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but is not limited thereto. For example, the first and second alignment electrodes ALE1 and ALE2 may include another conductive material such as carbon nano tube or graphene. That is, the first and second alignment electrodes ALE1 and ALE2 may have conductivity by including at least one of various conductive materials. In addition, the first and second alignment electrodes ALE1 and ALE2 may include the same conductive material or different conductive materials.

In one or more embodiments, at least one first alignment electrode ALE1 and at least one second alignment electrode ALE2 may be disposed in the emission area EA of each of the sub pixels SPX. For example, one first alignment electrode ALE1 may be disposed in a center of the emission area EA, and two second alignment electrodes ALE2 may be disposed on both sides of the first alignment electrode ALE1. The second alignment electrodes ALE2 may be integrally or non-integrally connected to each other to receive the same signal or power. The number, shape, size, and/or position of each of the first and second alignment electrodes ALE1 and ALE2 disposed in each emission area EA may be variously changed according to one or more embodiments.

Each of the first and second alignment electrodes ALE1 and ALE2 may be configured of a single layer or multiple layers. For example, the first and second alignment electrodes ALE1 and ALE2 may include a reflective electrode layer including a reflective conductive material (for example, metal). In addition, the first and second alignment electrodes ALE1 and ALE2 may selectively further include at least one of a transparent electrode layer disposed on and/or under the reflective electrode layer, and a conductive capping layer covering an upper portion of the reflective electrode layer and/or the transparent electrode layer.

The first insulating layer INS1 may be disposed on the first and second alignment electrodes ALE1 and ALE2. In one or more embodiments, the first insulating layer INS1 may include a plurality of contact holes (for example, third and fourth contact holes CH3 and CH4 of FIG. 12) for connecting the first and second alignment electrodes ALE1 and ALE2 to the first and second electrodes ELT1 and ELT2, respectively. In one or more embodiments, the first insulating layer INS1 may be formed entirely on the display area DA in which the first and second alignment electrodes ALE1 and ALE2 are formed (e.g., the first insulating layer INS1 may completely cover the first and second alignment electrodes ALE1 and ALE2), and may include opening portions exposing one portion of each of the first and second alignment electrodes ALE1 and ALE2. In a region in which the contact holes are formed in the first insulating layer INS1 (or a region in which the first insulating layer INS1 is opened), the first and second alignment electrodes ALE1 and ALE2 may be connected to the first and second electrodes ELT1 and ELT2, respectively. In one or more embodiments, the first insulating layer INS1 may be locally disposed only under a region in which the light emitting elements LD are arranged.

The first insulating layer INS1 may be configured of a single layer or multiple layers, and may include at least one inorganic insulating material and/or organic insulating material. In one or more embodiments, the first insulating layer INS1 may include at least one type of inorganic insulating material including silicon nitride ($SiN_x$), silicon oxide ($SiO_x$), or silicon oxynitride ($SiO_xN_y$).

As the first and second alignment electrodes ALE1 and ALE2 are covered by the first insulating layer INS1, damage to the first and second alignment electrodes ALE1 and ALE2 in a subsequent process may be prevented. In addition, an occurrence of a short defect due to an improper connection between the first and second alignment electrodes ALE1 and ALE2 and the light emitting elements LD may be prevented.

The first bank BNK1 may be disposed on the display area DA in which the first and second alignment electrodes ALE1 and ALE2 and the first insulating layer INS1 are formed. The first bank BNK1 may have opening portions corresponding to the emission areas EA of the sub pixels SPX, and may be formed in the non-emission area NEA to be around (e.g., surround) the emission areas EA of the sub pixels SPX. Accordingly, each emission area EA to which the light emitting elements LD are to be supplied may be defined (or partitioned). In one or more embodiments, the first bank BNK1 may include a light-shielding and/or reflective material including a black matrix material or the like. Accordingly, light interference between the sub pixels SPX may be prevented.

The light emitting elements LD may be supplied to each emission area EA, where the first bank BNK1 is around (e.g., surround) the emission area EA. The light emitting elements LD may be aligned between the first and second alignment electrodes ALE1 and ALE2 by first and second alignment signals applied to each first alignment electrode ALE1 (or a first alignment line before being separated to the first alignment electrode ALE1 of each of the sub pixels SPX) and each second alignment electrode ALE2 (or a second alignment line before being separated to the second alignment electrode ALE2 of each of the sub pixels SPX). For example, the light emitting elements LD supplied to each emission area EA may be arranged in the second direction DR2 or a diagonal direction so that the first end portions EP1 face (or oppose) the first alignment electrode ALE1 and the second end portions EP2 face (or oppose) the second alignment electrodes ALE2. For example, the light emitting elements LD may be disposed on the first insulating layer INS1 between the first and second alignment electrodes ALE1 and ALE2.

The second insulating layer INS2 (or also referred to as an "insulating pattern") may be disposed on one portion of the light emitting elements LD. For example, the second insulating layer INS2 may be disposed locally on one portion including a central portion of the light emitting elements LD to expose the first and second end portions EP1 and EP2 of the light emitting elements LD arranged in the emission area EA of the sub pixel SPX. When the second insulating layer INS2 is formed on the light emitting elements LD, the light emitting elements LD may be stably fixed and the first and second electrodes ELT1 and ELT2 may be stably separated.

The second insulating layer INS2 may be configured of a single layer or multiple layers, and may include at least one inorganic insulating material and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), aluminum oxide ($Al_xO_y$), and photoresist (PR) material.

Different electrodes among the first electrode ELT1, the second electrode ELT2, and the intermediate electrode IET may be formed on respective end portions of the light emitting elements LD, which are not covered by the second insulating layer INS2, that is, the first and second end portions EP1 and EP2. For example, the first electrode ELT1 may be disposed on the first end portion EP1 of the first light emitting element LD1, and the intermediate electrode IET may be disposed on the second end portion EP2 of the first light emitting element LD1. The intermediate electrode IET may be disposed on the first end portion EP1 of the second light emitting element LD2, and the second electrode ELT2 may be disposed on the second end portion EP2 of the second light emitting element LD2.

In FIGS. 7-9, the intermediate electrode IET disposed on the second end portion EP2 of the first light emitting element LD1 and the intermediate electrode IET disposed on the first end portion EP1 of the second light emitting element LD2 are separated from each other, the intermediate electrodes IET may be one intermediate electrode IET integrally or non-integrally connected. For example, in a plan view, the intermediate electrode IET disposed on the second end portion EP2 of the first light emitting element LD1 and the intermediate electrode IET disposed on the first end portion EP1 of the second light emitting element LD2 may be integrally connected.

Figure 11:
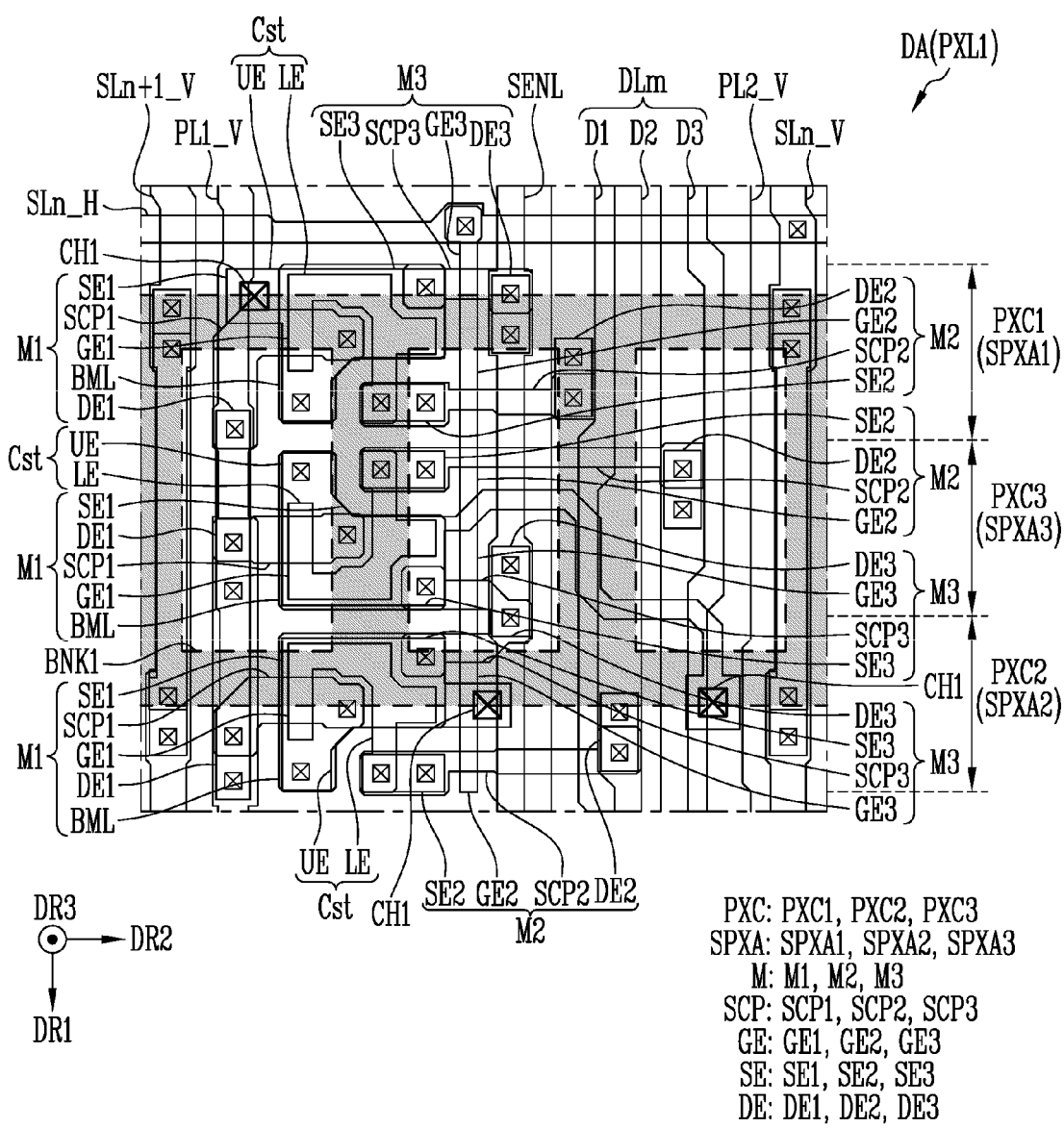
FIG. 11 is a plan view illustrating a first pixel of FIG. 10.
Figure 12:
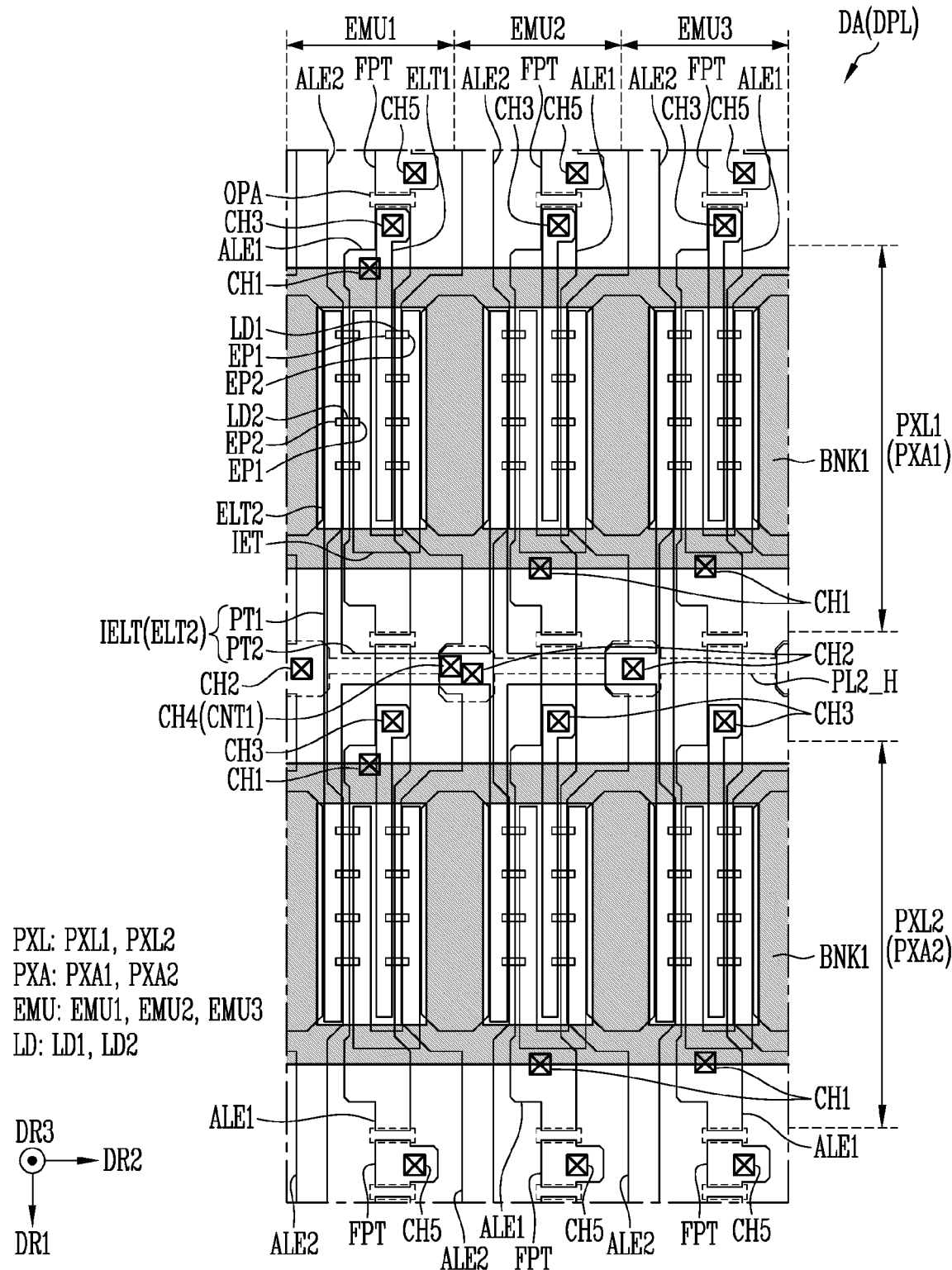
FIG. 12 is a plan view illustrating a display layer of a display area according to one or more embodiments of the present-disclosure.
Figure 13:
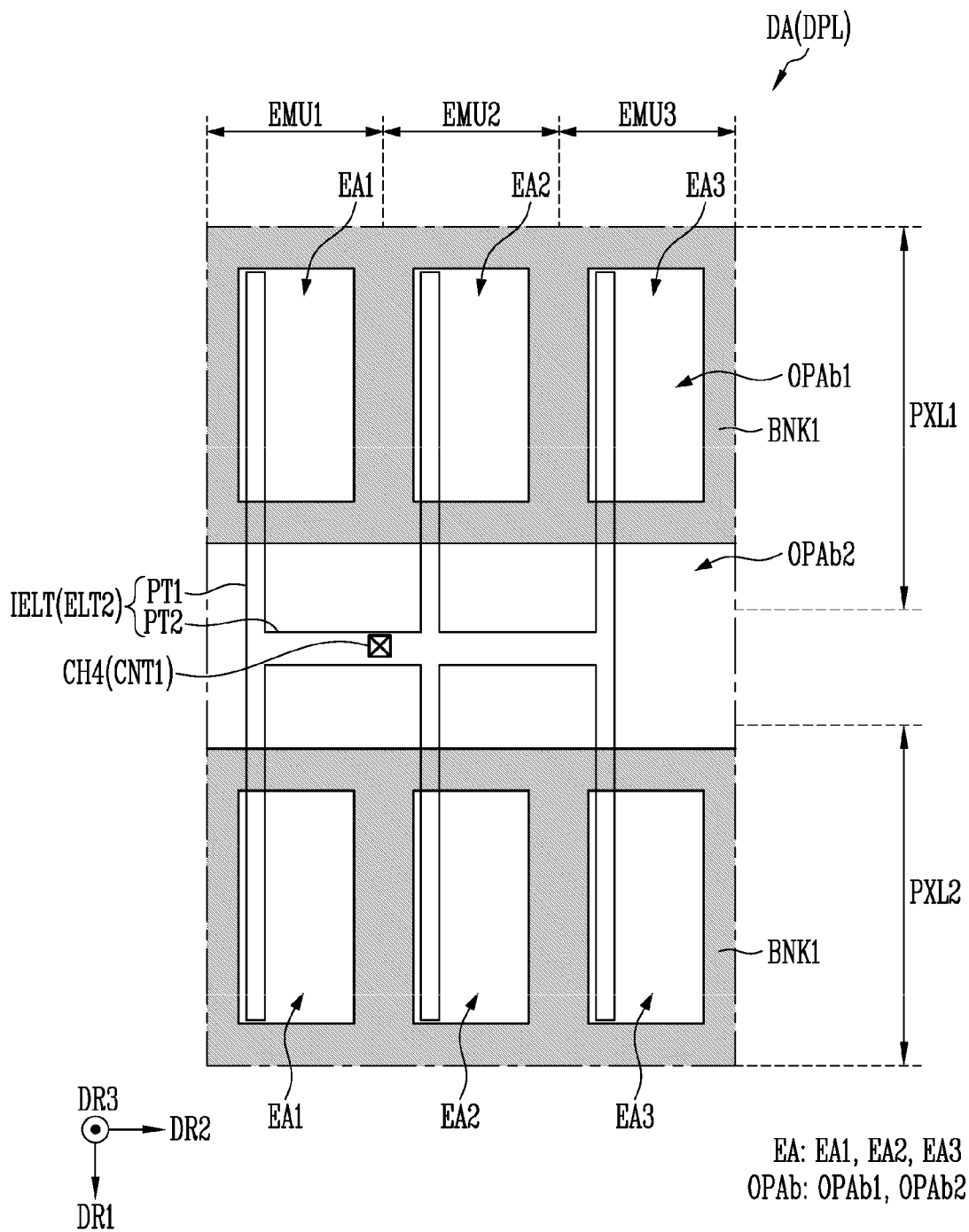
FIG. 13 is a plan view illustrating second electrodes and a first bank of FIG. 12.

In addition, in FIGS. 7-9, the first alignment electrode ALE1 and the first electrode ELT1 are separated from each other, but the first alignment electrode ALE1 and the first electrode ELT1 may be connected to each other through at least one contact hole (or contact portion) (e.g., see FIGS. 11-13). Similarly, in FIGS. 7-9, the second alignment electrodes ALE2 and the second electrode ELT2 are separated from each other, but the second alignment electrodes ALE2 and the second electrode ELT2 may be connected to each other through at least one contact hole (or contact portion) (e.g., see FIGS. 11-13).

Additionally, in FIGS. 7-9, the first transistor M1 and the first alignment electrode ALE1 are separated from each other, but the first transistor M1 and the first alignment electrode ALE1 of each sub pixel SPX may be connected to each other through at least one contact hole (or contact portion). The second alignment electrodes ALE2 and the second electrode ELT2 of each sub pixel SPX may be connected to the second power line PL2 (e.g., see FIGS. 11-13). The intermediate electrode IET may be connected to the first electrode ELT1 through the first light emitting element LD1 and may be connected to the second electrode ELT2 through the second light emitting element LD2.

The first electrode ELT1 may be disposed on the first alignment electrode ALE1 to overlap a portion of the first alignment electrode ALE1 in the third direction DR3, and the second electrode ELT2 may be disposed on the second alignment electrode ALE2 to overlap a portion of the second alignment electrode ALE2 in the third direction DR3. The intermediate electrode IET may be disposed on the first alignment electrode ALE1 and the second alignment electrode ALE2 to overlap another portion of each of the first alignment electrode ALE1 and the second alignment electrode ALE2 in the third direction DR3.

The first electrode ELT1, the second electrode ELT2, and/or the intermediate electrode IET may be formed at the same or different layers. For example, a mutual position, and/or a formation order of the first electrode ELT1, the second electrode ELT2, and the intermediate electrode IET may be variously changed according to one or more embodiments.

In the embodiment of FIG. 7, the intermediate electrode IET may be first formed on the second insulating layer INS2. The intermediate electrode IET may be in direct contact with the second end portion EP2 of the first light emitting element LD1 and the first end portion EP1 of the second light emitting element LD2, and thus may be connected between the first light emitting element LD1 and the second light emitting element LD2, but is not limited thereto. Thereafter, the third insulating layer INS3 may be formed in each emission area EA to cover at least the intermediate electrode IET and overlap the second insulating layer INS2, and the first electrode ELT1 and the second electrode ELT2 may be formed in each emission area EA in which the third insulating layer INS3 is formed to overlap the third insulating layer INS3. The first electrode ELT1 and the second electrode ELT2 may be formed concurrently (e.g., simultaneously) or sequentially. The first electrode ELT1 may be connected to the first end portion EP1 of the first light emitting element LD1 by directly contacting the first end portion EP1 of the first light emitting element LD1, and the second electrode ELT2 may be connected to the second end portion EP2 of the second light emitting element LD2 by directly contacting the second end portion EP2 of the second light emitting element LD2, but are not limited thereto.

In the embodiment of FIG. 8, the first electrode ELT1 and the second electrode ELT2 may be first formed on the second insulating layer INS2. The first electrode ELT1 and the second electrode ELT2 may be formed concurrently (e.g., simultaneously) or sequentially. Thereafter, the third insulating layer INS3 may be formed to cover the first electrode ELT1 and the second electrode ELT2 and overlap the second insulating layer INS2, and the intermediate electrode IET may be formed in each emission area EA in which the third insulating layer INS3 is formed to overlap the third insulating layer INS3. The third insulating layer INS3 may insulate the first electrode ELT1 and the second electrode ELT2 from the intermediate electrode IET.

As in the embodiments of FIGS. 7 and 8, when the electrodes disposed on the first end portion EP1 and the second end portion EP2 of each light emitting element LD are disposed at different layers, the electrodes may be stably separated and a short defect may be prevented.

In the embodiment of FIG. 9, the first electrode ELT1, the second electrode ELT2, and the intermediate electrode IET may be disposed at the same layer of the display layer DPL, and may be formed concurrently (e.g., simultaneously) or sequentially. In this case, the third insulating layer INS3 may be omitted. In the embodiment of FIG. 9, when the electrodes disposed on the first end portions EP1 and the second end portions EP2 of the light emitting elements LD are concurrently formed (e.g., simultaneously formed) at the same layer, a pixel process may be simplified and manufacturing efficiency may be increased.

As in the embodiment of FIG. 4, when each sub pixel SPX includes the light emitting unit EMU of a parallel structure, the sub pixel SPX may not include the intermediate electrode IET. In this case, the first electrode ELT1 is disposed on the first end portions EP1 of the light emitting elements LD, and the second electrode ELT2 may be disposed on the second end portions EP2 of the light emitting elements LD.

The first electrode ELT1, the second electrode ELT2, and the intermediate electrode IET may include at least one conductive material. In one or more embodiments, the first electrode ELT1, the second electrode ELT2, and the intermediate electrode IET may include a transparent conductive material so that light emitted from the light emitting elements LD may transmit.

In one or more embodiments, the display panel DP may include the light conversion layer CCL provided on the light emitting elements LD. For example, the light conversion layer CCL may be disposed in each emission area EA in which the light emitting elements LD are arranged.

In addition, the display panel DP may further include the second bank BNK2 disposed in the non-emission area NEA to overlap the first bank BNK1. The second bank BNK2 may define (or partition) each emission area EA in which the light conversion layer CCL is to be formed. In one or more embodiments, the second bank BNK2 may be integrated with the first bank BNK1.

The second bank BNK2 may include a light-shielding and/or reflective material including a black matrix material or the like. Accordingly, light interference between the sub pixels SPX may be prevented. The second bank BNK2 may include a material that is the same as or different from that of the first bank BNK1.

The light conversion layer CCL may include wavelength conversion particles (or color conversion particles) that convert a wavelength and/or a color of the light emitted from the light emitting elements LD, and/or light scattering particles SCT that increase light emission efficiency by scattering the light emitted from the light emitting elements LD. For example, in each light emitting unit EMU, each light conversion layer CCL including the wavelength conversion particles including at least one type of quantum dot QD (for example, red, green, and/or blue quantum dots), and/or the light scattering particles SCT may be provided.

For example, when any one sub pixel SPX is set as a red (or green) sub pixel, and blue light emitting elements LD are provided to the light emitting unit EMU of the sub pixel SPX, on the light emitting unit EMU of the sub pixel SPX, a light conversion layer CCL including a red (or green) quantum dot QD for converting blue light into red (or green) light may be disposed. In addition, the light conversion layer CCL may further include the light scattering particles SCT.

The fourth insulating layer INS4 may be formed on one surface of the base layer BSL including the light emitting units EMU and/or the light conversion layers CCL of the sub pixels SPX.

In one or more embodiments, the fourth insulating layer INS4 may include an organic and/or inorganic insulating layer, and may substantially planarize a surface of the display layer DPL. The fourth insulating layer INS4 may protect the light emitting units EMU and/or the light conversion layers CCL.

The color filter layer CFL may be disposed on the fourth insulating layer INS4.

The color filter layer CFL may include color filters CF corresponding to the colors of the sub pixels SPX. For example, the color filter layer CFL may include a first color filter CF1 disposed on the first light emitting unit EMU1 of the first sub pixel SPX1, a second color filter CF2 disposed on the second light emitting unit EMU2 of the second sub pixel SPX2, and a third color filter CF3 disposed on the third light emitting unit EMU3 of the third sub pixel SPX3. In one or more embodiments, the first, second, and third color filters CF1, CF2, and CF3 may be disposed to overlap each other in the third direction DR3 in the non-emission area NEA to block light interference between the sub pixels SPX. In one or more embodiments, the first, second, and third color filters CF1, CF2, and CF3 may be formed separately from each other on the first, second, and third light emitting units EMU1, EMU2, EMU3 (for example, the emission areas EA of the first, second, and third light emitting units EMU1, EMU2, and EMU3), respectively, and a separate light shielding pattern or the like may be disposed between the first, second, and third color filters CF1, CF2, and CF3.

The encapsulation layer ENC may be disposed on the color filter layer CFL. The encapsulation layer ENC may include at least one organic and/or inorganic insulating layer including a fifth insulating layer INS5. The fifth insulating layer INS5 may be entirely formed in the display area DA to cover the pixel circuit layer PCL, the display layer DPL, and/or the color filter layer CFL.

The fifth insulating layer INS5 may be configured of a single layer or multiple layers, and may include at least one inorganic insulating material and/or organic insulating material. As an example, the fifth insulating layer INS5 may include various types of organic/inorganic insulating materials including silicon nitride ($SiN_x$), silicon oxide ($SiO_x$), silicon oxynitride ($SiO_xN_y$), or aluminum oxide ($Al_xO_y$).

In one or more embodiments, the fifth insulating layer INS5 may be formed of multiple layers. For example, the fifth insulating layer INS5 may include at least two inorganic insulating layers and at least one organic insulating layer interposed between the at least two inorganic insulating layers. However, the material and/or structure of the fifth insulating layer INS5 may be variously changed. In addition, according to one or more embodiments, at least one overcoat layer, a filler layer, an upper substrate, and/or the like may be further disposed on the fifth insulating layer INS5.

Figure 10:
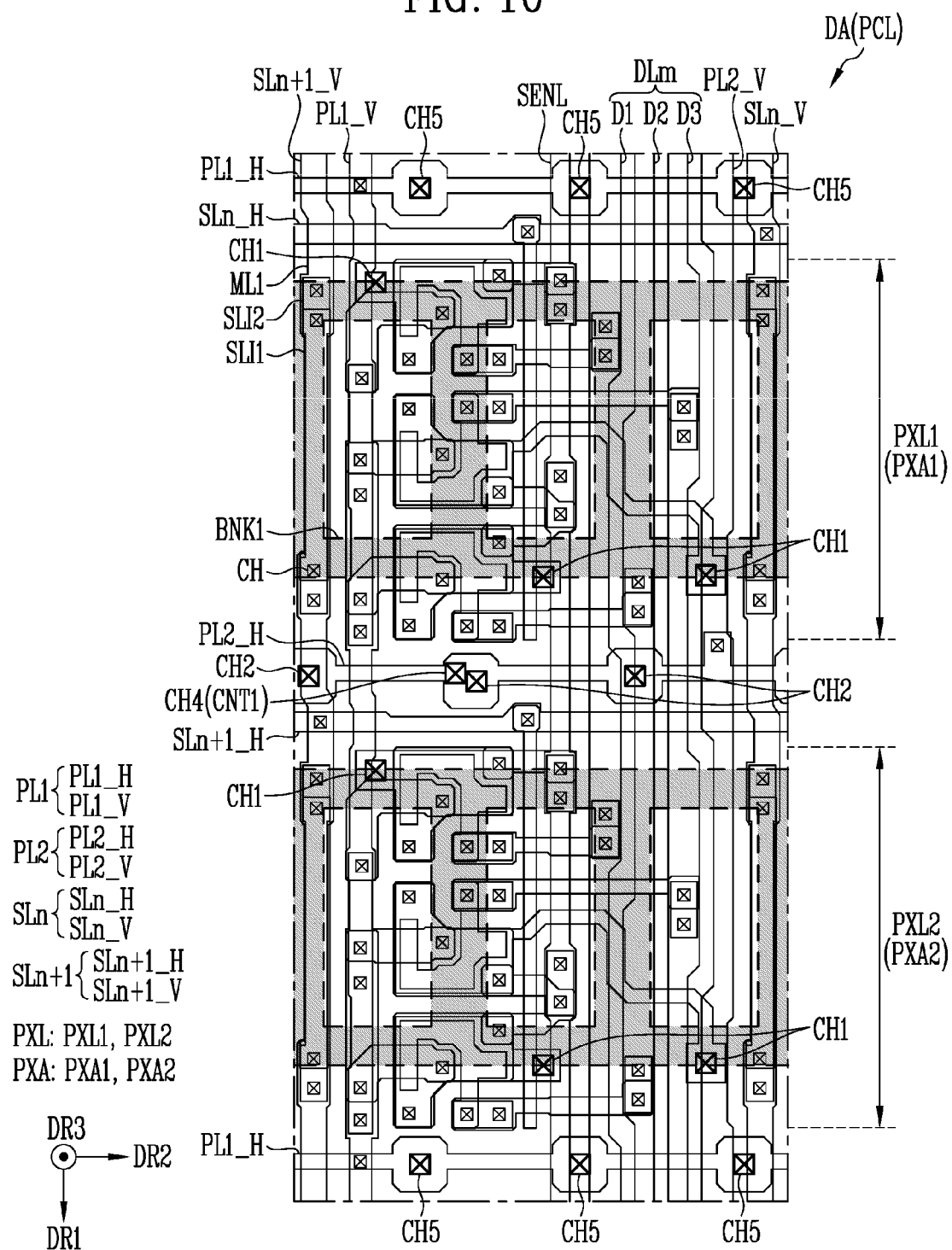
FIG. 10 is a plan view illustrating a pixel circuit layer of a display area according to one or more embodiments of the present disclosure.

FIG. 10 is a plan view illustrating the pixel circuit layer PCL of the display area DA according to one or more embodiments of the present disclosure. For example, FIG. 10 shows an embodiment of a structure of the pixel circuit layer PCL centering on the first pixel area PXA1 and the second pixel area PXA2 in which the first pixel PXL1 and the second pixel PXL2 of FIG. 6 are disposed.

FIG. 11 is a plan view illustrating the first pixel PXL1 of FIG. 10. Other pixels PXL including the second pixel PXL2 may have substantially the same or similar structure as the first pixel PXL1.

In FIGS. 10 and 11, the first bank BNK1 disposed on the display layer DPL is shown together so as to represent a position relationship on a plane between the circuit elements and the lines of the pixel circuit layer PCL and the light emitting units EMU of the display layer DPL (for example, the emission areas EA of each of the light emitting units EMU).

Referring to FIGS. 3-11, the pixel circuit layer PCL may include a plurality of pixel circuits PXC disposed in each pixel area PXA. For example, the pixel circuit layer PCL may include the first pixel circuit PXC1, the second pixel circuit PXC2, and the third pixel circuit PXC3 disposed in a first circuit area SPXA1, a second circuit area SPXA2, and a third circuit area SPXA3, respectively, of each pixel area PXA.

The pixel circuit layer PCL may further include various lines connected to the pixels PXL. For example, the pixel circuit layer PCL may further include the scan lines SL, the data lines DL, the sensing lines SENL, and the first and second power lines PL1 and PL2. Because the arrangement structure, the extension direction, the position on the cross section, and/or the like of the scan lines SL, the data lines DL, the sensing lines SENL, and the first and second power lines PL1 and PL2 are described in the embodiments of FIGS. 6-9, a detailed description thereof is omitted.

The pixel circuit layer PCL may further include a plurality of contact holes CH for connecting various circuit elements (e.g., predetermined circuit elements), electrodes, and/or lines disposed on the pixel circuit layer PCL to each other. For convenience, in FIGS. 10 and 11, a symbol is marked to only one contact hole on behalf of the contact holes CH for connecting specific elements in the pixel circuit layer PCL.

In one or more embodiments, at least one line may include at least two sub lines disposed on different layers on the base layer BSL. For example, the second sub scan line of each of the scan lines SL including the second sub scan lines SLn_V and SLn+1_V of the n-th scan line SLn and the (n+1)-th scan line SLn+1 may be formed of a lines of multiple layers including a main line ML1 disposed at the same layer as the bottom metal layers BML, the first sub line SLI1 disposed at the same layer as the gate electrodes GE, and the second sub line SLI2 disposed at the same layer as the source and drain electrodes SE and DE. The main line ML1, the first sub line SLI1, and the second sub line SLI2 may be connected to each other through contact holes CH formed in the corresponding second sub scanning line. Accordingly, a signal delay may be prevented by reducing or minimizing a resistance of the scan lines SL, and the pixels PXL may be stably driven.

The pixel circuit layer PCL may include the first contact holes CH1, the second contact holes CH2, the third contact holes CH3, the fourth contact holes CH4, and fifth contact holes CH5 formed between the display layer DPL and the pixel circuit layer PCL. In FIGS. 10 and 11, only one fourth contact hole CH4 is shown, but a structure shown in FIGS. 10 and 11 may be repeatedly disposed in the display area DA along the first direction DR1 and the second direction DR2, and thus the pixel circuit layer PCL may include the plurality of fourth contact holes CH4.

Each first contact hole CH1 may connect each pixel circuit PXC and a corresponding light emitting unit EMU. For example, the first contact hole CH1 formed in each first sub pixel SPX1 may be formed between the first pixel circuit PXC1 and the first alignment electrode ALE1 of the first light emitting unit EMU1. Similarly, the first contact hole CH1 formed in each second sub pixel SPX2 may be formed between the second pixel circuit PXC2 and the first alignment electrode ALE1 of the second light emitting unit EMU2, and the first contact hole CH1 formed in each third sub pixel SPX3 may be formed between the third pixel circuit PXC3 and the first alignment electrode ALE1 of the third light emitting unit EMU3.

The second contact holes CH2 may connect the second power line PL2 and the second alignment electrodes ALE2 of the light emitting units EMU. For example, the second contact holes CH2 may be formed between the (2-2)-th sub power lines PL2_H repeatedly disposed for each of two or more horizontal lines and the second alignment electrodes ALE2 of the light emitting units EMU positioned in a vicinity of the (2-2)-th second sub power lines PL2_H. Accordingly, in a manufacturing process of the pixels PXL (for example, an alignment process of the light emitting elements LD), the second alignment signal may be supplied to the second alignment electrodes ALE2 through the second power line PL2.

Each of the fourth contact holes CH4 (also referred to as a "first contact portion CNT1") may connect the light emitting units EMU and the second power line PL2 of at least two pixels PXL adjacent to each other along the first direction DR1 and/or the second direction DR2. For example, the fourth contact hole CH4 disposed between the first pixel PXL1 and the second pixel PXL2 may commonly connect the second electrodes ELT2 (e.g., see FIG. 7) formed in the first, second, and third light emitting units EMU1, EMU2, and EMU3 of the first and second pixels PXL1 and PXL2 to the (2-2)-th sub power line PL2_H disposed between the first pixel PXL1 and the second pixel PXL2.

The fifth contact holes CH5 may connect the first power line PL1 and floating patterns FPT of FIG. 12 of the display layer DPL. For example, the fifth contact holes CH5 may be formed between the (1-2)-th sub power lines PL1_H (e.g., see FIG. 6) repeatedly disposed for each of two or more horizontal lines, and the floating patterns FPT overlapping the (1-2)-th sub power lines PL1_H. The floating patterns FPT may be first formed integrally with the first alignment electrodes ALE1 in a pixel manufacturing process to configure a first alignment line together with the first alignment electrodes ALE1. Accordingly, in an alignment process of the light emitting elements LD, the first alignment signal may be supplied to the first alignment line through the first power line PL1. After the alignment process of the light emitting elements LD is completed, the first alignment line may be disconnected around the fifth contact holes CH5 to separate the floating patterns FPT from the first alignment electrodes ALE1. Accordingly, the sub pixels SPX may be individually driven.

Each of the first contact hole CH1, the second contact hole CH2, the fourth contact hole CH4, and the fifth contact hole CH5 may be configured of at least one contact hole and/or via hole. For example, each of the first contact hole CH1, the second contact hole CH2, the fourth contact hole CH4, and the fifth contact hole CH5 may be configured of a single contact hole (or contact portion) or via hole formed at a corresponding position, or may include two or more contact holes and/or via holes formed densely at the corresponding position and connect the same elements.

Each pixel circuit PXC may include the first transistor M1, the second transistor M2, the third transistor M3, and the capacitor Cst disposed in each circuit area SPXA. For example, the first pixel circuit PXC1 may include the first transistor M1, the second transistor M2, the third transistor M3, and the storage capacitor Cst disposed in the first circuit area SPXA1 of the corresponding pixel area PXA. Similarly, the second pixel circuit PXC2 may include the first transistor M1, the second transistor M2, the third transistor M3, and the storage capacitor Cst disposed in the second circuit area SPXA2 of the corresponding pixel area PXA, and the third pixel circuit PXC3 may include the first transistor M1, the second transistor M2, the third transistor M3, and the storage capacitor Cst disposed in the third circuit area SPXA3 of the corresponding pixel area PXA.

Each first transistor M1 may include a first semiconductor pattern SCP1, a first gate electrode GE1, a first source electrode SE1, and a first drain electrode DE1. In addition, each the first transistor M1 may further include the bottom metal layer BML overlapping the first gate electrode GE1 in the third direction DR3.

The first semiconductor pattern SCP1 may overlap the first gate electrode GE1 and the bottom metal layer BML in the third direction DR3, and may be connected to the first source electrode SE1 and the first drain electrode DE1. For example, respective end portions of the first semiconductor pattern SCP1 may be connected to the first source electrode SE1 and the first drain electrode DE1 through respective contact holes CH.

The first gate electrode GE1 may be connected to a lower electrode LE of the capacitor Cst and a second source electrode SE2. For example, the first gate electrode GE1 may be integrally connected to the lower electrode LE of the capacitor Cst, and may be connected to the second source electrode SE2 through at least one contact hole CH.

The first source electrode SE1 may be connected to an upper electrode UE of the capacitor Cst and a third source electrode SE3. For example, the first source electrode SE1 may be integrally connected to the upper electrode UE of the capacitor Cst and the third source electrode SE3. In addition, the first source electrode SE1 may be connected to the first electrode ELT1 formed in the light emitting unit EMU of the corresponding sub pixel SPX through each first contact hole CH1. For example, the first source electrode SE1 of the first pixel circuit PXC1, the upper electrode UE of the capacitor Cst, and the third source electrode SE3 may be connected to the first alignment electrode ALE1 of the first light emitting unit EMU1 through the first contact hole CH1 connecting the first pixel circuit PXC1 and the first light emitting unit EMU1, and may be connected to the first electrode ELT1 of the first light emitting unit EMU1 through the first alignment electrode ALE1.

The first drain electrode DE1 may be connected to the first power line PL1. For example, the first drain electrode DE1 may be connected to the (1-1)-th sub power line PL1_V through at least one contact hole CH.

The bottom metal layer BML may overlap the first semiconductor pattern SCP1 and the first gate electrode GE1 in the third direction DR3 and may be connected to the first source electrode SE1. For example, the bottom metal layer BML may be connected to the first source electrode SE1 through at least one contact hole CH.

Each second transistor M2 may include a second semiconductor pattern SCP2, a second gate electrode GE2, a second source electrode SE2, and a second drain electrode DE2.

The second semiconductor pattern SCP2 may overlap the second gate electrode GE2 in the third direction DR3 and may be connected to the second source electrode SE2 and the second drain electrode DE2. For example, respective end portions of the second semiconductor pattern SCP2 may be connected to the second source electrode SE2 and the second drain electrode DE2 through respective contact holes CH.

The second gate electrode GE2 may be connected to the scan line SL. For example, the second gate electrode GE2 may be connected to each scan line SL (for example, the first sub scan line SLn_H of the n-th scan line SLn) through at least one contact hole CH.

The second source electrode SE2 may be connected to the lower electrode LE of the capacitor Cst and the first gate electrode GE1. For example, the second source electrode SE2 may be connected to the lower electrode LE of the capacitor Cst and the first gate electrode GE1 through at least one contact hole CH.

The second drain electrode DE2 may be connected to the sub data line of the corresponding sub pixel SPX. For example, the second drain electrode DE2 of the first pixel circuit PXC1 may be connected to the first sub data line D1 through at least one contact hole CH, the second drain electrode DE2 of the second pixel circuit PXC2 may be connected to the second sub data line D2 through at least one contact hole CH, and the second drain electrode DE2 of the third pixel circuit PXC3 may be connected to the third sub data line D3 through at least one hole CH.

Each third transistor M3 may include a third semiconductor pattern SCP3, a third gate electrode GE3, a third source electrode SE3, and a third drain electrode DE3.

The third semiconductor pattern SCP3 may overlap the third gate electrode GE3 in the third direction DR3 and may be connected to the third source electrode SE3 and the third drain electrode DE3. For example, respective end portions of the third semiconductor pattern SCP3 may be connected to the third source electrode SE3 and the third drain electrode DE3 through respective contact holes CH.

The third gate electrode GE3 may be connected to each scan line SL, or may be connected to a separate control line SSL separated from the scan line SL. In one or more embodiments, the third gate electrode GE3 may be integrally connected to the second gate electrode GE2 and may be connected to each scan line SL through at least one contact hole CH.

The third source electrode SE3 may be connected to the upper electrode UE of the capacitor Cst and the first source electrode SE1. For example, the third source electrode SE3 may be integrally connected to the upper electrode UE of the capacitor Cst and the first source electrode SE1.

The third drain electrode DE3 may be connected to the sensing line SENL. For example, the third drain electrode DE3 may be connected to the sensing line SENL through at least one contact hole CH.

The capacitor Cst may include the lower electrode LE and the upper electrode UE.

The lower electrode LE of the capacitor Cst may be connected to the first gate electrode GE1 and the second source electrode SE2. For example, the lower electrode LE of the capacitor Cst may be integrally connected to the first gate electrode GE1 and the second source electrode SE2.

The upper electrode UE of the capacitor Cst may be connected to the first source electrode SE1 and the third source electrode SE3. For example, the upper electrode UE of the capacitor Cst may be integrally connected to the first source electrode SE1 and the third source electrode SE3.

In one or more embodiments, the bottom metal layers BML provided in the display area DA and at least some lines extending in the first direction DR1 may be disposed at the same layer of the pixel circuit layer PCL. For example, the bottom metal layers BML, the second sub scan lines (for example, the main lines ML1 of the second sub scan lines including the second sub scan lines SLn_V and SLn+1_V of the n-th scan line SLn and (n+1)-th scan line SLn+1 of FIG.

6) the (1-1)-th sub power lines PL1_V, the sensing lines SENL, the data lines DL (for example, the first, second, and third sub data lines D1, D2, and D3) and the (2-1)-th sub power lines PL2_V may be disposed on the first conductive layer of the pixel circuit layer PCL and may be concurrently formed (e.g., simultaneously formed).

In an embodiment, the semiconductor patterns SCP provided in the display area DA may be disposed on the same layer of the pixel circuit layer PCL. For example, the semiconductor patterns SCP may be disposed on the semiconductor layer of the pixel circuit layer PCL and may be simultaneously formed.

In one or more embodiments, the gate electrodes GE provided in the display area DA, the lower electrodes LE of the capacitors Cst, and/or at least one sub line (for example, the first sub lines SLI1 of the second sub scan lines including the second sub scan lines SLn_V and SLn+1_V of the n-th scan line SLn and the (n+1)-th scan line SLn+1) may be disposed at the same layer of the pixel circuit layer PCL. For example, the gate electrodes GE, the lower electrodes LE of the capacitors Cst, and the first sub lines SLI1 of the second sub scan lines may be disposed on the second conductive layer (for example, a gate layer) of the pixel circuit layer PCL, and may be concurrently formed (e.g., simultaneously formed).

In one or more embodiments, the source electrodes SE provided in the display area DA, the drain electrodes DE, the upper electrodes UE of the capacitors Cst, and at least one lines extending in the second direction DR2 and/or at least one sub line (for example, the second sub lines SLI2 of the second sub scan lines including the second sub scan lines SLn_V and SLn+1_V of the n-th scan line SLn and the (n+1)-th scan line SLn+1 may be disposed at the same layer of the pixel circuit layer PCL. For example, the source electrodes SE, the drain electrodes DE, the upper electrodes UE of the capacitors Cst, the first sub scan lines (for example, the first sub scan lines SLn_H and SLn+1_H of the n-th scan line SLn and the (n+1)-th scan line SLn+1), the (1-2)-th sub power lines PL1_H, the (2-2)-th sub power lines PL2_H, and the second sub lines SLI2 of the second sub scan lines may be disposed on the third conductive layer (for example, a source-drain layer) of the pixel circuit layer PCL.

In the embodiments of FIGS. 10 and 11, the area occupied by each pixel circuit PXC may be reduced by efficiently disposing the circuit elements and the lines of the pixel circuit layer PCL. Accordingly, the pixel PXL according to the above-described embodiment may be usefully applied to a high-resolution display device DD of which the area of the pixel area PXA is narrow, as in the high-resolution display device DD.

FIG. 12 is a plan view illustrating the display layer DPL of the display area DA according to one or more embodiments of the present disclosure. For example, FIG. 12 illustrates an embodiment of a structure of the display layer DPL centering on the first pixel area PXA1 and the second pixel area PXA2 in which the first pixel PXL1 and the second pixel PXL2 of FIG. 6 are disposed. In one or more embodiments, the display layer DPL of FIG. 12 may be disposed to overlap the pixel circuit layer PCL of FIG. 10 in the third direction DR3. For example, the display layer DPL of FIG. 12 may be disposed on the pixel circuit layer PCL of FIG. 10. FIG. 13 is a plan view illustrating the second electrodes ELT2 (integrated electrode IELT) and the first bank BNK1 of FIG. 12.

Referring to FIGS. 3-13, each light emitting unit EMU may include at least one first alignment electrode ALE1, at least one second alignment electrode ALE2, at least one light emitting element LD, the first electrode ELT1, and the second electrode ELT2. In one or more embodiments, each light emitting unit EMU may include a plurality of light emitting elements LD divided and connected to at least two series stages, and may further include at least one intermediate electrode IET connected between the series stages.

For example, the light emitting unit EMU may include the first alignment electrode ALE1 positioned at the center of the emission area EA, and a plurality of second alignment electrodes ALE2 positioned at both sides of the first alignment electrode ALE1. In one or more embodiments, the second alignment electrode ALE2 positioned on a left side of the first alignment electrode ALE1 may be integrally connected to the second alignment electrode ALE2 (for example, the second alignment electrode ALE2 positioned on a right side of the first alignment electrode ALE1 in an adjacent sub pixel SPX) of the adjacent sub pixel SPX adjacent to the left side of the corresponding sub pixel SPX. Similarly, the second alignment electrode ALE2 positioned on the right side of the first alignment electrode ALE1 may be integrally connected to the second alignment electrode ALE2 (for example, the second alignment electrode ALE2 positioned on the left side of the first alignment electrode ALE1 in the adjacent sub pixel SPX) of the adjacent sub pixel SPX adjacent to the right side of the corresponding sub pixel SPX. In addition, the second alignment electrodes ALE2 disposed in the display area DA may be integrally or non-integrally connected to each other in and/or around the display area DA.

The first alignment electrode ALE1 of each of the sub pixels SPX may be disposed on the display layer DPL to be positioned between the pixel circuit layer PCL and each first electrode ELT1. In addition, the first alignment electrode ALE1 of each of the sub pixels SPX may be connected to the pixel circuit PXC of the corresponding sub pixel SPX through each first contact hole CH1, and may be connected to the first electrode ELT1 of the corresponding sub pixel SPX through each third contact hole CH3. Accordingly, the pixel circuit PXC of each sub pixel SPX may be connected to the first electrode ELT1 of the light emitting unit EMU.

In one or more embodiments, the first alignment electrodes ALE1 provided in the display area DA may be formed to be first connected to each other in the pixel manufacturing process. For example, the first alignment electrodes ALE1 may be formed to be integrally connected to the floating patterns FPT to configure the first alignment line. The floating patterns FPT may be connected to the first power line PL1 (for example, the (1-2)-th sub power lines PL1_H) of the pixel circuit layer PCL through the fifth contact holes CH5. Accordingly, in the alignment process of the light emitting elements LD, the first alignment signal may be supplied to the first alignment line through the first power line PL1. After the alignment process of the light emitting elements LD is completed, the first alignment line may be disconnected around the fifth contact holes CH5 to disconnect between the first alignment electrodes ALE1 and the first power line PL1. For example, the first alignment line may be separated into the first alignment electrodes ALE1 and the floating patterns FPT by disconnecting the first alignment line in disconnection areas OPA (also referred to as "open areas" or "etch areas") positioned around the floating patterns FPT (for example, upper and lower areas). In addition, the first alignment electrodes ALE1 of the adjacent sub pixels SPX may be separated by disconnecting the first alignment line in the disconnection areas OPA between adjacent pixel rows. Accordingly, the first alignment electrodes ALE1 of the sub pixels SPX may be separated from each other, and thus the sub pixels SPX may be individually driven.

The second alignment electrodes ALE2 of the sub pixels SPX may be disposed on the display layer DPL to be positioned between the pixel circuit layer PCL and each second electrode ELT2. In addition, the second alignment electrodes ALE2 of the sub pixels SPX may be spaced from each first alignment electrode ALE1 and positioned around the first alignment electrode ALE1.

The second alignment electrodes ALE2 of the sub pixels SPX may be integrally or non-integrally connected to each other, and may be commonly connected to the second power line PL2. For example, the second alignment electrodes ALE2 of the sub pixels SPX adjacent along the first direction DR1 and/or the second direction DR2 may be integrally connected to each other.

The second alignment electrodes ALE2 may be connected to the second power line PL2 (for example, the (2-2)-th sub power lines PL2_H) through the second contact holes CH2. In one or more embodiments, the second alignment electrodes ALE2 may also be connected to the second electrodes ELT2 of the sub pixels SPX through the fourth contact holes CH4 formed one by one for each pixel group including the plurality of pixels PXL.

The second alignment electrodes ALE2 may receive the second alignment signal through the second power line PL2 in the alignment process of the light emitting elements LD. The first alignment signal and the second alignment signal may have different waveforms, potentials, and/or phases. Accordingly, an electric field may be formed between the first alignment line (or the first alignment electrode ALE1) and the second alignment electrodes ALE2 (or the second alignment line formed by the second alignment electrodes ALE2), and thus the light emitting elements LD may be aligned between the first alignment line and the second alignment electrodes ALE2.

When the display device DD is actually driven, the second power VSS may be supplied to the second alignment electrodes ALE2 through the second power line PL2. Accordingly, a driving current may flow through each sub pixel SPX.

Each of the first alignment electrodes ALE1 and the second alignment electrodes ALE2 may extend in the first direction DR1 in the emission areas EA of the light emitting units EMU, and the first alignment electrodes ALE1 and the second alignment electrodes ALE2 may be spaced from each other along the second direction DR2. However, the shape, size, number, position, mutual arrangement structure, and/or the like of the first alignment electrodes ALE1 and the second alignment electrodes ALE2 may be variously changed according to one or more embodiments.

The first bank BNK1 may be disposed in the display area DA in which the first alignment electrodes ALE1 and the second alignment electrodes ALE2 are disposed. The first bank BNK1 may be disposed to be around (e.g., surround) the emission area EA of each of the sub pixels SPX, and may be collectively removed in a region between pixels PXL (for example, the first and second pixels PXL1 and PXL2) adjacent along the first direction.

For example, the first bank BNK1 may include first opening portions OPAb1 individually opened corresponding to a first emission area EA1 of each of the first sub pixels SPX1, a second emission area EA2 of each of the second sub pixels SPX2, and a third emission area EA3 of each of the third sub pixels SPX3, and second opening portions OPAb2 collectively opened between pixel rows sequentially arranged along the first direction DR1. For example, the first bank BNK1 may be formed only in an area (e.g., a peripheral area of the emission areas EA) required to divide the emission areas EA to supply the light emitting elements LD to each emission area EA, and may not be formed in other areas.

The light emitting elements LD may be aligned between the first alignment electrode ALE1 and the second alignment electrodes ALE2 in each emission area EA. The fact that the light emitting elements LD are disposed and/or aligned between the first and second alignment electrodes ALE1 and ALE2 means that at least a portion of each of the light emitting elements LD is positioned in a region between the first and second alignment electrodes ALE1 and ALE2, in a plan view. In addition, each of the light emitting elements LD may or may not overlap the first alignment electrode ALE1 and/or the second alignment electrode ALE2 positioned in the vicinity.

In one or more embodiments, each light emitting element LD may be a subminiature (for example, nanometer scale to micrometer scale small size) inorganic light emitting diode using a material of an inorganic crystal structure. For example, each light emitting element LD may be a subminiature inorganic light emitting diode manufactured by growing and etching a nitride-based semiconductor into a rod shape. However, the type, size, shape, structure, number, and/or the like of the light emitting elements LD configuring each light emitting unit EMU may be changed.

In one or more embodiments, the light emitting elements LD may be prepared in a form dispersed in a solution, and may be supplied to each emission area EA through an inkjet method, a slit coating method, or the like. When the first and second alignment signals are applied to the first and second alignment electrodes ALE1 and ALE2 (or the first and second alignment lines) of the sub pixels SPX in a state in which the light emitting elements LD are supplied to each emission area EA, respectively, the light emitting elements LD are aligned between the first and second alignment electrodes ALE1 and ALE2. After the light emitting elements LD are aligned, a solvent may be removed through a drying process or the like.

In one or more embodiments, the light emitting elements LD may include the first light emitting elements LD1 aligned between the first alignment electrode ALE1 and any one second alignment electrode ALE2 (for example, the second alignment electrode ALE2 positioned on the right side of the first alignment electrode ALE1), and the second light emitting elements LD2 aligned between the first alignment electrode ALE1 and another second alignment electrode ALE2 (for example, the second alignment electrode ALE2 positioned on the left side of the first alignment electrode ALE1). The first electrode ELT1 may be disposed on the first end portions EP1 of the first light emitting elements LD1, and the intermediate electrode IET may be disposed on the second end portions EP2 of the first light emitting elements LD1. The intermediate electrode IET may be disposed on the first end portions EP1 of the second light emitting elements LD2, and the second electrode ELT2 may be disposed on the second end portions EP2 of the second light emitting elements LD2.

Each first electrode ELT1 may be disposed on the first end portions EP1 so as to be electrically connected to the first end portions EP1 of the first light emitting elements LD1 aligned in the corresponding emission area EA. In addition, each first electrode ELT1 may be connected to each first alignment electrode ALE1 through the third contact hole CH3 formed in the corresponding light emitting unit EMU, connected to the pixel circuit PXC of the corresponding sub pixel SPX through the first alignment electrode ALE1, and connected to the first power line PL1 through the pixel circuit PXC.

In one or more embodiments, the third contact holes CH3 of the sub pixels SPX may be disposed outside the emission area EA and may be formed in a region that does not overlap the first bank BNK1. For example, the third contact holes CH3 may be formed in a region (for example, a non-inkjet region where the first bank BNK1 is not formed and the light emitting elements LD are not supplied) corresponding to the second opening portions OPAb2 of the first bank BNK1, and may be formed at a position that is spaced from the first bank BNK1 by a suitable distance (e.g., predetermined distance) or more. In this case, the third contact holes CH3 may be formed on a relatively flat region by avoiding a region where a step difference due to the first bank BNK1 occurs. Accordingly, the first electrodes ELT1 and the third contact holes CH3 may be easily and/or stably formed. In addition, as the first electrodes ELT1 and the third contact holes CH3 are stably formed, a pixel defect (for example, a short defect or the like due to a residue of a conductive layer used in formation of the first electrodes ELT1) may be prevented or reduced. In the above-described embodiment, a separation distance between the third contact holes CH3 and the first bank BNK1 may be sufficiently secured by removing the first bank BNK1 in the remaining areas except for minimum areas required to partition the emission areas EA.

Each intermediate electrodes IET may be disposed on the second end portions EP2 of the first light emitting elements LD1 and the first end portions EP1 of the second light emitting elements LD2 so as to be electrically connected to the second end portions EP2 of the first light emitting elements LD1 and the first end portions EP1 of the second light emitting elements LD2 aligned in the corresponding emission area EA. Each intermediate electrode IET may be connected to the first and second electrodes ELT1 and ELT2 through the first and second light emitting elements LD1 and LD2, respectively.

Each second electrode ELT2 may be disposed on the second end portions EP2 of the second light emitting elements LD2 so as to be electrically connected to the second end portions EP2 of the second light emitting elements LD2 aligned in the corresponding emission area EA.

In one or more embodiments, the plurality of pixels PXL including at least two pixels PXL sequentially arranged along the first direction DR1 may form one pixel group, and the second electrodes ELT2 of the sub pixels SPX included in the pixel group may be integrally connected to each other to configure an integrated electrode IELT (for example, a single integrated electrode IELT). The integrated electrode IELT may be connected to the second power line PL2 through the fourth contact hole CH4 (first contact portion CNT1) formed between and/or around the plurality of pixels PXL. For example, each integrated electrode IELT may extend in the second direction DR2 in a region overlapping the (2-2)-th sub power line PL2_H, and may be connected to the (2-2)-th sub power line PL2_H through each fourth contact hole CH4. For example, the second electrodes ELT2 of the sub pixels SPX of the first and second pixels PXL1 and PXL2 may be integrally patterned to configure one integrated electrode IELT, and may be commonly connected to the (2-2)-th sub power line PL2_H disposed under the fourth contact hole CH4 through one fourth contact hole CH4 formed between the first and second pixels PXL1 and PXL2.

The integrated electrode IELT may be directly connected to the (2-2)-th sub power line PL2_H through the fourth contact hole CH4, or may be connected to the (2-2)-th sub power line PL2_H through the fourth contact hole CH4 and the second alignment electrode ALE2 overlapping the fourth contact hole CH4. The (2-2)-th sub power line PL2_H may overlap a second pattern portion PT2 of the integrated electrode IELT. For example, the (2-2)-th sub power line PL2_H may overlap the second pattern portion PT2 of the integrated electrode IELT in at least a region in which the fourth contact hole CH4 is formed, and may extend in the second direction DR2 in the display area DA.

The structure shown in FIGS. 12 and 13 may be repeatedly disposed in the display area DA. For example, two pixels PXL adjacent to each other along the first direction DR1 in the display area DA may form a pair to form one pixel group, and the second electrodes ELT2 of the sub pixels SPX included in each pixel group may be integrally connected to configure one integrated electrode IELT. In addition, one integrated electrode IELT may be connected to the second power line PL2 of the pixel circuit layer PCL through one fourth contact hole CH4.

The number of pixels PXL and/or sub pixels SPX included in the pixel group in which one integrated electrode IELT is formed may be variously changed according to one or more embodiments. For example, in consideration of a factor such as a contact resistance, k (k is a natural number of equal to or greater than 2) pixels PXL arranged adjacent to each other in the display area DA may be grouped into one pixel group, the second electrodes ELT2 provided to the sub pixels SPX of the pixels PXL may be formed as one integrated electrode IELT.

Because each pixel group may include at least two pixels PXL sequentially arranged along the first direction DR1 and each pixel PXL may include the plurality of sub pixels SPX arranged along the second direction DR2 in the emission areas EA, the integrated electrode IELT may have a mesh shape. For example, the integrated electrode IELT may include first pattern portions PT1 extending in the first direction DR1 and at least one second pattern portion PT2 extending in the second direction DR2. For example, the integrated electrode IELT may include the first pattern portions PT1 extending in the first direction DR1 in each of the sub pixels SPX of the first and second pixels PXL1 and PXL2, and the second pattern portion PT2 extending in the second direction DR2 between the first and second pixels PXL1 and PXL2 and connecting the first pattern portions PT1.

As in the above-described embodiment, when the second electrodes ELT2 of the plurality of sub pixels SPX included in each group of pixels PXL are integrated to share the fourth contact hole CH4, the number of fourth contact holes CH4 formed in the display area DA may be greatly reduced. For example, when the second electrodes ELT2 of six sub pixels SPX included in the first pixel PXL1 and the second pixel PXL2 are integrally patterned and the second electrodes ELT2 are connected to the second alignment electrode ALE2 and/or the second power line PL2 through one fourth contact hole CH4, the number of fourth contact holes CH4 may be reduced to about ⅙ compared to a case where the second electrode ELT2 of each sub pixel SPX is individually connected to the second alignment electrode ALE2 and/or the second power line PL2. In addition, when the second electrodes ELT2 of the sub pixels SPX included in three or more pixels PXL are integrally connected and the second electrodes ELT2 are connected to the second alignment electrode ALE2 and/or the second power line PL2 through one fourth contact hole CH4, the number of the fourth contact holes CH4 may be greatly reduced.

As the number of fourth contact holes CH4 is reduced, an additional space may be secured in the display area DA. The secured space may be used to expand the emission areas EA to secure a high-resolution inkjet area, or may be used for other purposes, such as disposing an additional line, pattern, element, and/or the like. In addition, as the number of the fourth contact holes CH4 is reduced, a manufacturing process of the display device DD may be simplified and/or facilitated, and a defect rate may be reduced.

In one or more embodiments, the third and/or fourth contact holes CH3 and CH4 may be disposed outside the emission area EA, and may be formed in a region that does not overlap the first bank BNK1. For example, the third contact hole CH3 and/or the fourth contact hole CH4 may be formed in a region corresponding to the second opening portions OPAb2 of the first bank BNK1, and may be formed at a position that is spaced from the first bank BNK1 by a suitable distance (e.g., a predetermined distance) or more. In this case, the third and fourth contact holes CH3 and CH4 may be formed on a flat region by avoiding a region where a step difference due to the first bank BNK1 occurs. Accordingly, the first and second electrodes ELT1 and ELT2 may be easily patterned, and the third and fourth contact holes CH3 and CH4 may be formed. In addition, as the first and second electrodes ELT1 and ELT2 and the third and fourth contact holes CH3 and CH4 are stably formed, a pixel defect (for example, a short defect or the like due to a residue of a conductive layer used in formation of the first and second electrodes ELT1 and ELT2) may be prevented or reduced.

In addition, when the first bank BNK1 is collectively removed in the remaining areas except for minimum areas required to partition the emission areas EA, a separation distance between the third and fourth contact holes CH3 and CH4 and the first bank BNK1 may be sufficiently secured.

Additionally, as in the above-described embodiment, when the second electrodes ELT2 of each pixel group are formed as a mesh-type integrated electrode IELT including the first and second patterns PT1 and PT2 and the integrated electrode IELT is connected to the mesh-type second power line PL2 of the pixel circuit layer PCL, a resistance of the second power line PL2 and the integrated electrode IELT may be greatly reduced. Accordingly, a voltage drop of the second power VSS may be effectively prevented, and the second power VSS may be uniformly supplied to the pixels PXL.

Figure 14:
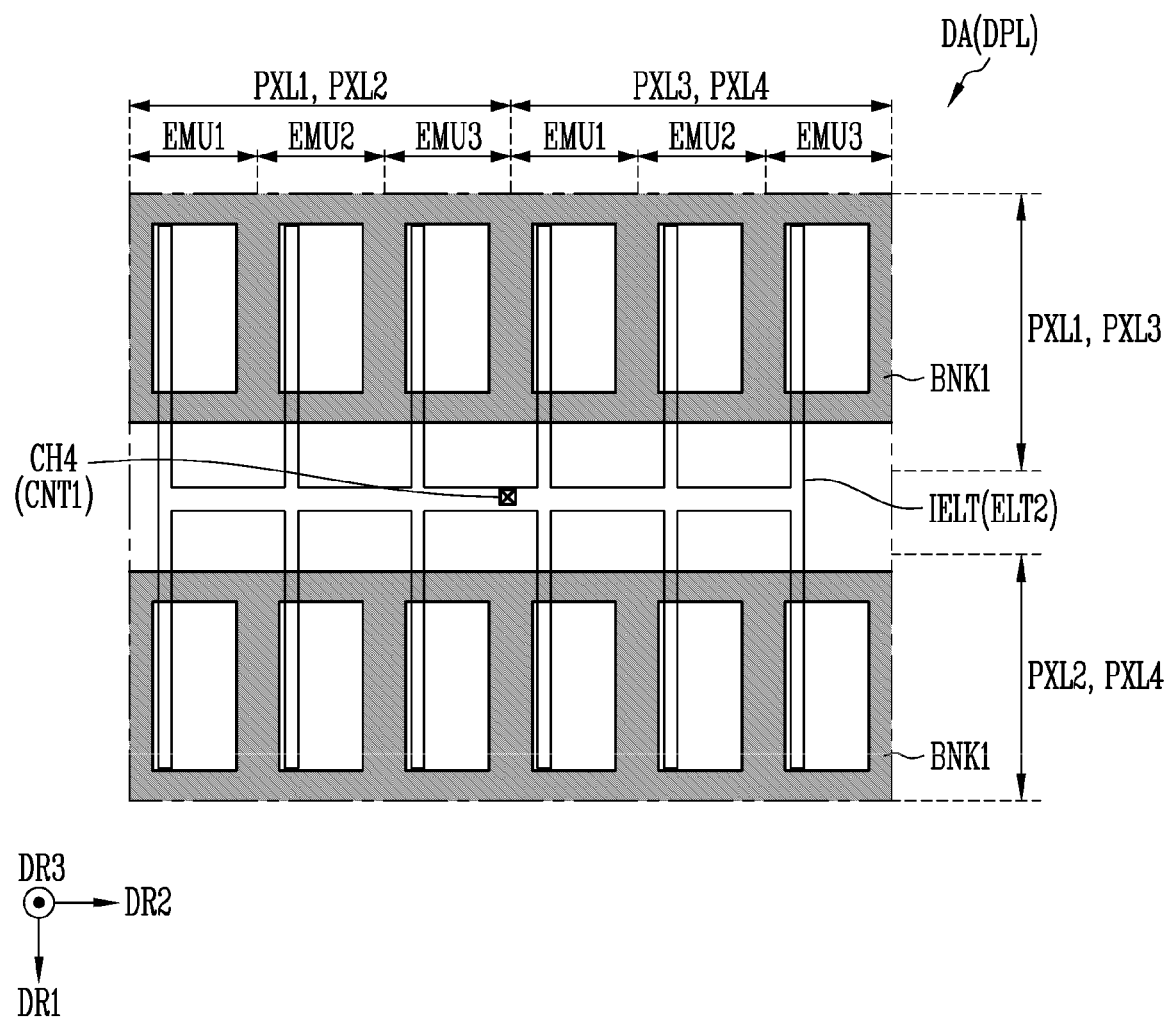
Figure 15:
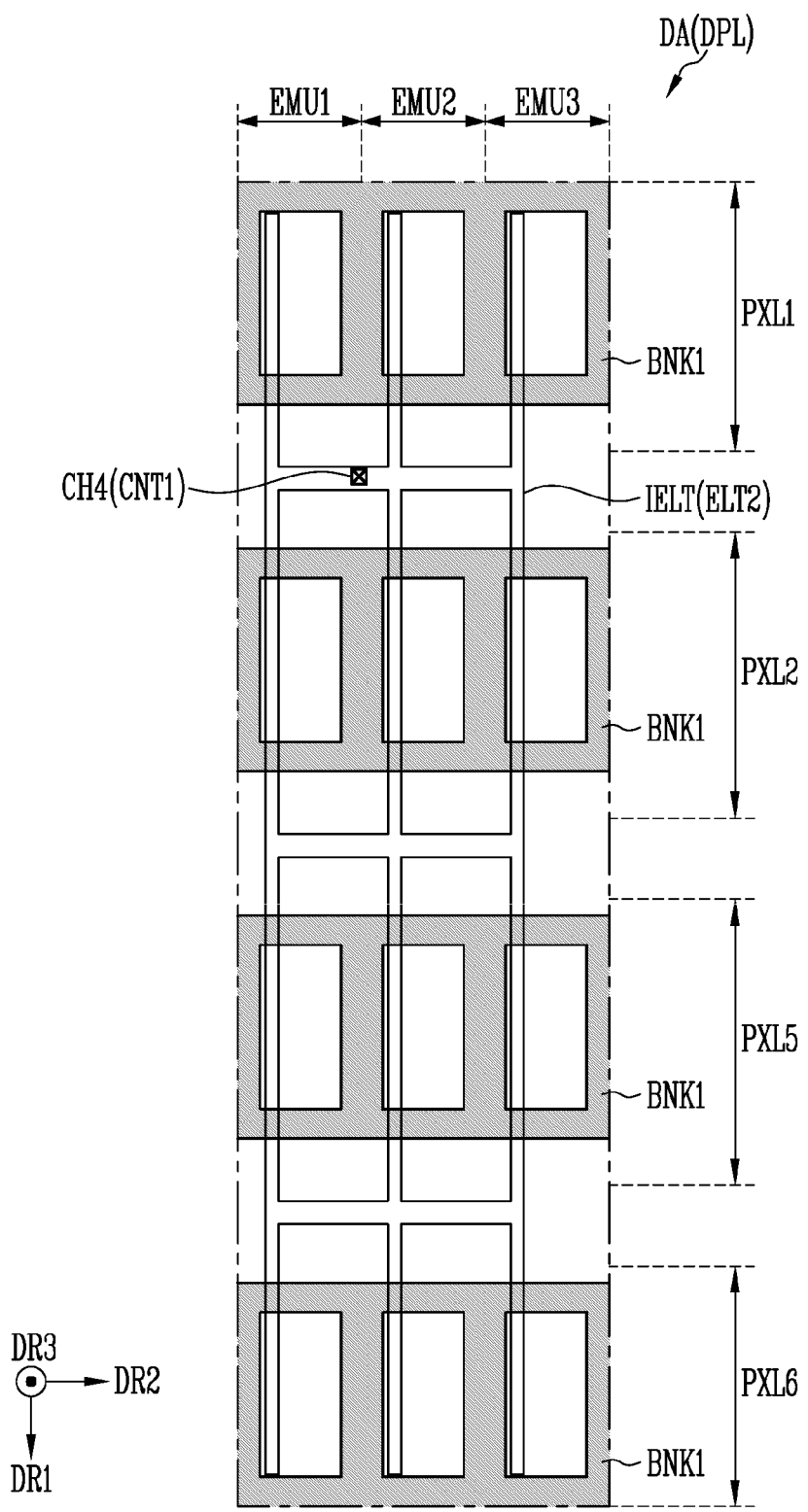

FIGS. 14-16 are plan views each illustrating the second electrodes ELT2 and the first bank BNK1 according to one or more embodiments of the disclosure. For example, FIGS. 14-16 illustrate different modification embodiments of the embodiments of FIGS. 12 and 13, and each embodiment is described centering on the second electrodes ELT2. In describing the embodiments of FIGS. 14-16, a detailed description of a configuration similar or identical to that of FIGS. 12 and 13 is omitted.

Referring to FIGS. 12-14, one pixel group in which the second electrodes ELT2 are integrated and/or integrally connected may include the plurality of pixels PXL in the second direction DR2 as well. For example, the second electrodes ELT2 of the first and second pixels PXL1 and PXL2 and third and fourth pixels PXL3 and PXL4 adjacent to the first and second pixels PXL1 and PXL2 along the second direction DR2 may be integrally formed to configure one integrated electrode IELT. The third pixel PXL3 may be disposed subsequent (e.g., adjacent) to the first pixel PXL1 along the second direction DR2, and the fourth pixel PXL4 may be disposed subsequent (e.g., adjacent) to the second pixel PXL2 along the second direction DR2.

For example, the pixel group may include the first to fourth pixels PXL1 to PXL4 arranged in a 2*2 matrix form, and the second electrodes ELT2 of the sub pixels SPX included in the first to fourth pixels PXL1 to PXL4 may be integrally connected to each other to configure one integrated electrode IELT. The integrated electrode IELT may be commonly connected to the (2-2)-th sub power line PL2_H formed between two pixel rows in which the second power line PL2 (for example, the first to fourth pixels PXL1 to PXL4) is disposed, through one fourth contact hole CH4.

Referring to FIGS. 12-15, one pixel group in which the second electrodes ELT2 are integrated and/or integrally connected may include three or more pixels PXL along the first direction DR1. For example, the second electrodes ELT2 of the sub pixels SPX of the first and second pixels PXL1 and PXL2 and fifth and sixth pixels PXL5 and PXL6 sequentially disposed subsequent (e.g., adjacent) to the first and second pixels PXL1 and PXL2 along the first direction DR1 may be integrally formed to configure one integrated electrode IELT.

For example, the pixel group may include the first, second, fifth, and sixth pixels PXL1, PXL2, PXL5, and PXL6 arranged in a 4*1 matrix form, and the second electrodes ELT2 of the sub pixels SPX of the first, second, fifth, and sixth pixels PXL1, PXL2, PXL5, and PXL6 may be integrally connected to each other to configure one integrated electrode IELT. The integrated electrode IELT may be commonly connected to the second power line PL2 (for example, the (2-2)-th sub power line PL2_H formed between two pixel rows in which the first and second pixels PXL1 and PXL2 are disposed, or the (2-2)-th sub power line PL2_H formed between two pixel rows in which the fifth and sixth pixels PXL5 and PXL6 are disposed), through one fourth contact hole CH4.

Referring to FIGS. 12-16, a pixel group may be configured to include a larger number of pixels PXL along the first direction DR1 and/or the second direction DR2. For example, the second electrodes ELT2 of the first and second pixels PXL1 and PXL2, the third and fourth pixels PXL3 and PXL4 adjacent to the first and second pixels PXL1 and PXL2 along the second direction DR2, the fifth and sixth pixels PXL5 and PXL6 sequentially disposed subsequent (e.g., adjacent) to the first and second pixels PXL1 and PXL2 along the first direction DR1, and seventh and eighth pixels PXL7 and PXL8 sequentially disposed subsequent (e.g., adjacent) to the third and fourth pixels PXL3 and PXL4 along the first direction DR1 and disposed subsequent (e.g., adjacent) to the fifth and sixth pixels PXL5 and PXL6 respectively along the second direction DR2 may be integrally formed to configure one integrated electrode IELT.

For example, the pixel group may include the first to eighth pixels PXL1 to PXL8 arranged in a 4*2 matrix form, and the second electrodes ELT2 of the sub pixels SPX of the first to eighth pixels PXL1 to PXL8 may be integrally connected to each other to configure one integrated electrode IELT. The integrated electrode IELT may be commonly connected to the second power line PL2 (for example, the (2-2)-th sub power line PL2_H formed between two pixel rows in which the first to fourth pixels PXL1 to PXL4 are disposed, or the (2-2)-th sub power line PL2_H formed between two pixel rows in which the fifth to eighth pixels PXL5 to PXL8 are disposed), through one fourth contact hole CH4.

In addition to the above-described embodiments, the number of pixels PXL configuring one pixel group may be variously changed. In addition, in the above-described embodiments, a structure in which one integrated electrode IELT is connected to the second power line PL2 only through one fourth contact hole CH4 is disclosed, but the present disclosure is not limited thereto. For example, in consideration of a size (for example, a length and/or an area) of the integrated electrode IELT, a contact characteristic in the fourth contact hole CH4, and/or the like, one integrated electrode IELT may be connected to the second power line PL2 through two or more fourth contact holes CH4.

According to various embodiments of the present disclosure as described above, the display device DD may include the first pixel PXL1 and the second pixel PXL2 sequentially arranged along the first direction DR1. Each of the first and second pixels PXL1 and PXL2 may include the plurality of sub pixels SPX arranged along the second direction DR2 based on the emission areas EA. The second electrodes ELT2 included in the sub pixels SPX of at least two pixels PXL including the first and second pixels PXL1 and PXL2 may be integrally connected, and the integrally connected second electrodes ELT2 may be commonly connected to the second power line PL2 through the fourth contact hole CH4 (first contact portion CNT1). According to the above-described embodiments, the number of contact portions (for example, fourth contact holes CH4) formed between the pixels PXL and the second power line PL2 may be reduced.

Additionally, the display device DD according to one or more embodiments of the present disclosure may further include the first bank BNK1 disposed in the display area DA to be around (e.g., surround) the emission area EA of each of the sub pixels SPX. The first bank BNK1 may include the first opening portions OPAb1 individually opened in correspondence with the emission areas EA of the sub pixels SPX, and the second opening portions OPAb2 integrally opened between adjacent pixel rows. In a region in which the second opening portions OPAb2 are formed, the first electrodes ELT1 and the second electrodes ELT2 of the sub pixels SPX may be connected to the first alignment electrodes ALE1 and the second power line PL2, respectively. Accordingly, the first and second electrodes ELT1 and ELT2 of the sub pixels SPX may be easily formed, and the third and fourth contact holes CH3 and CH4 for connecting the first and second electrodes ELT1 and ELT2 to the first alignment electrodes ALE1 and the second power line PL2, respectively, may be easily formed.

Although the aspects and features of embodiments of the present disclosure has been described in detail in accordance with the above-described embodiments, it should be noted that the above-described embodiments are for the purpose of description and not of limitation. In addition, those skilled in the art may understand that various modifications are possible within the scope of the technical spirit of the present disclosure.

The scope of the present disclosure is not limited to the details described in the detailed description of the specification, but should be defined by the claims. In addition, it is to be construed that all changes or modifications derived from the meaning and scope of the claims and equivalent concepts thereof are included in the spirit and scope of the present disclosure.

What is claimed is:

1. A display device comprising:
pixels comprising a first pixel and a second pixel sequentially arranged in a display area along a first direction, each of the first pixel and the second pixel comprising sub pixels arranged along a second direction corresponding to emission areas; and
a first power line and a second power line connected to the pixels,
wherein each of the sub pixels comprises a light emitting element, a first electrode connected between the light emitting element and the first power line, and a second electrode connected between the light emitting element and the second power line, and
wherein the second electrodes of the sub pixels of the first and second pixels are integrally connected to each other to configure an integrated electrode, and are commonly connected to the second power line through a first contact portion.

2. The display device according to claim 1, wherein the integrated electrode comprises:
first pattern portions extending in the first direction in each of the sub pixels of the first and second pixels; and
a second pattern portion extending in the second direction between the first and second pixels and connecting the first pattern portions.

3. The display device according to claim 2, wherein the second power line comprises a sub power line between the first pixel and the second pixel, the sub power line extending in the second direction in the display area and overlapping the second pattern portion.

4. The display device according to claim 1, wherein the pixels further comprise a third pixel arranged adjacently to the first pixel along the second direction, and a fourth pixel arranged adjacently to the second pixel along the second direction.

5. The display device according to claim 4, wherein the second electrodes of the sub pixels of the first to fourth pixels are integrally connected to each other to configure the integrated electrode, and are commonly connected to the second power line through the first contact portion.

6. The display device according to claim 4, wherein the pixels further include fifth and sixth pixels sequentially arranged adjacently to the first and second pixels along the first direction, and
wherein the second electrodes of sub pixels of the first, second, fifth, and sixth pixels are integrally connected to each other to configure the integrated electrode, and are commonly connected to the second power line through the first contact portion.

7. The display device according to claim 6, wherein the pixels further include a seventh pixel arranged adjacently to the fifth pixel along the second direction, and an eighth pixel arranged adjacently to the sixth pixel along the second direction, and
wherein the second electrodes of sub pixels of the first to eighth pixels are integrally connected to each other to configure the integrated electrode, and are commonly connected to the second power line through the first contact portion.

8. The display device according to claim 1, further comprising:
a first bank located in the display area around the emission area of each of the sub pixels of the pixels,
wherein the first bank comprises:
first openings individually opened in correspondence with the emission area of each of the sub pixels of the pixels; and
second openings collectively opened between pixel rows sequentially arranged along the first direction.

9. The display device according to claim 8, wherein each of the sub pixels comprises:
a light emitting unit comprising the light emitting element, the first electrode, and the second electrode; and a pixel circuit connected between the light emitting unit and the first power line.

10. The display device according to claim 9, further comprising:
   a display layer comprising the light emitting units of the sub pixels and the first bank; and
   a pixel circuit layer overlapping the display layer and comprising pixel circuits of the sub pixels, the first power line, and the second power line.

11. The display device according to claim 10, wherein the light emitting unit further comprises:
   a first alignment electrode located at the display layer and positioned between the pixel circuit layer and the first electrode; and
   a second alignment electrode located at the display layer and positioned between the pixel circuit layer and the second electrode.

12. The display device according to claim 11, wherein the first alignment electrodes of the sub pixels are separated from each other, and
   wherein the second alignment electrodes of the sub pixels are connected to each other.

13. The display device according to claim 11, wherein the first alignment electrodes of the sub pixels are connected to respective pixel circuits through respective first contact holes, and
   wherein the second alignment electrodes of the sub pixels are connected to the second power line through respective second contact holes.

14. The display device according to claim 13, wherein the first electrodes of the sub pixels are connected to respective first alignment electrodes through respective third contact holes, and are connected to the first power line through the respective first alignment electrodes and the respective pixel circuits, and
   wherein the second electrodes of the sub pixels are connected to the second power line through the first contact portion.

15. The display device according to claim 14, wherein the third contact holes of the sub pixels and the first contact portion are located in a region corresponding to the second openings so as not to overlap the first bank.

16. The display device according to claim 9, wherein the light emitting unit comprises:
   an intermediate electrode connected between the first electrode and the second electrode;
   a first light emitting element connected between the first electrode and the intermediate electrode; and
   a second light emitting element connected between the intermediate electrode and the second electrode.

17. The display device according to claim 9, wherein the light emitting units of the sub pixels of the first pixel are arranged along the second direction in a first pixel area in which the first pixel is provided, and
   wherein the pixel circuits of the sub pixels of the first pixel are arranged along the first direction in the first pixel area.

18. The display device according to claim 1, further comprising:
   scan lines connected to the pixels,
   wherein each of the scan lines comprises a plurality of sub scan lines extending in the first direction and the second direction, respectively, in the display area.

19. The display device according to claim 1, wherein the first power line comprises a (1-1)-th sub power line and a (1-2)-th sub power line extending in the first direction and the second direction, respectively, in the display area, and
   wherein the second power line comprises a (2-1)-th sub power line and a (2-2)-th sub power line extending in the first direction and the second direction, respectively, in the display area.

20. The display device according to claim 19, wherein the integrated electrode extends in the second direction in a region overlapping the (2-2)-th sub power line, and is connected to the (2-2)-th sub power line through the first contact portion.

* * * * *